(12) United States Patent
Wu et al.

(10) Patent No.: US 12,048,163 B2
(45) Date of Patent: Jul. 23, 2024

(54) TRENCH GATE HIGH VOLTAGE TRANSISTOR FOR EMBEDDED MEMORY

(71) Applicant: Taiwan Semiconductor Manufacturing Company, Ltd., Hsin-Chu (TW)

(72) Inventors: Wei Cheng Wu, Zhubei (TW); Alexander Kalnitsky, San Francisco, CA (US); Chien-Hung Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/364,022

(22) Filed: Aug. 2, 2023

(65) Prior Publication Data

US 2023/0380171 A1   Nov. 23, 2023

Related U.S. Application Data

(63) Continuation of application No. 17/533,339, filed on Nov. 23, 2021, now Pat. No. 11,812,616, which is a
(Continued)

(51) Int. Cl.
*H10B 43/35* (2023.01)
*H01L 21/033* (2006.01)
(Continued)

(52) U.S. Cl.
CPC ......... *H10B 43/35* (2023.02); *H01L 21/0337* (2013.01); *H01L 29/0649* (2013.01);
(Continued)

(58) Field of Classification Search
None
See application file for complete search history.

(56) References Cited

U.S. PATENT DOCUMENTS 9,659,953 B2   5/2017   Chuang et al.
10,164,074 B2   12/2018   Wu et al.
(Continued)

OTHER PUBLICATIONS

Non-Final Office Action dated Oct. 5, 2020 for U.S. Appl. No. 16/404,983.
(Continued)

*Primary Examiner* — Daniel Whalen
(74) *Attorney, Agent, or Firm* — Eschweiler & Potashnik, LLC

(57) ABSTRACT

Various embodiments of the present application are directed to an IC, and associated forming methods. In some embodiments, the IC has a plurality of logic devices disposed on a logic region of a substrate, including a first logic device configured to operate at a first voltage and comprising a first logic gate electrode separated from the substrate by a first logic gate dielectric. The first logic gate dielectric is disposed along sidewall and bottom surfaces of a logic device trench of the substrate, and the first logic gate electrode is disposed conformally along the first logic gate dielectric within the logic device trench. A hard mask layer is disposed on the first logic gate electrode within the logic device trench.

20 Claims, 14 Drawing Sheets

Related U.S. Application Data continuation of application No. 16/404,983, filed on May 7, 2019, now Pat. No. 11,189,628.

(60) Provisional application No. 62/689,893, filed on Jun. 26, 2018.

(51) Int. Cl.
*H01L 21/28* (2006.01)
*H01L 29/06* (2006.01)
*H01L 29/423* (2006.01)
*H10B 43/50* (2023.01)

(52) U.S. Cl.
CPC .. *H01L 29/40117* (2019.08); *H01L 29/42352* (2013.01); *H10B 43/50* (2023.02)

(56) References Cited

U.S. PATENT DOCUMENTS

| | | | |
|---|---|---|---|
| 11,189,628 | B2 | 11/2021 | Wu et al. |
| 2006/0099762 | A1 | 5/2006 | Kim |
| 2009/0020808 | A1 | 1/2009 | Yu |
| 2014/0167155 | A1 | 6/2014 | Zundel et al. |
| 2015/0137206 | A1* | 5/2015 | Liu .................. H01L 21/76224 438/266 |
| 2016/0005756 | A1 | 1/2016 | Chuang et al. |
| 2016/0056250 | A1 | 2/2016 | Chuang et al. |
| 2016/0315088 | A1 | 10/2016 | Kang et al. |
| 2017/0236833 | A1 | 8/2017 | Chuang et al. |
| 2017/0345841 | A1 | 11/2017 | Wu et al. |
| 2018/0151579 | A1 | 5/2018 | Liu et al. |
| 2018/0151580 | A1 | 5/2018 | Wu et al. |
| 2018/0151707 | A1 | 5/2018 | Wu et al. |
| 2018/0254278 | A1* | 9/2018 | Nagai .................. H10B 12/053 |

OTHER PUBLICATIONS

Final Office Action dated Apr. 21, 2021 for U.S. Appl. No. 16/404,983.
Notice of Allowance dated Jul. 30, 2021 for U.S. Appl. No. 16/404,983.
Non-Final Office Action dated Mar. 14, 2023 for U.S. Appl. No. 17/533,339.
Notice of Allowance dated Jul. 3, 2023 for U.S. Appl. No. 17/533,339.

* cited by examiner

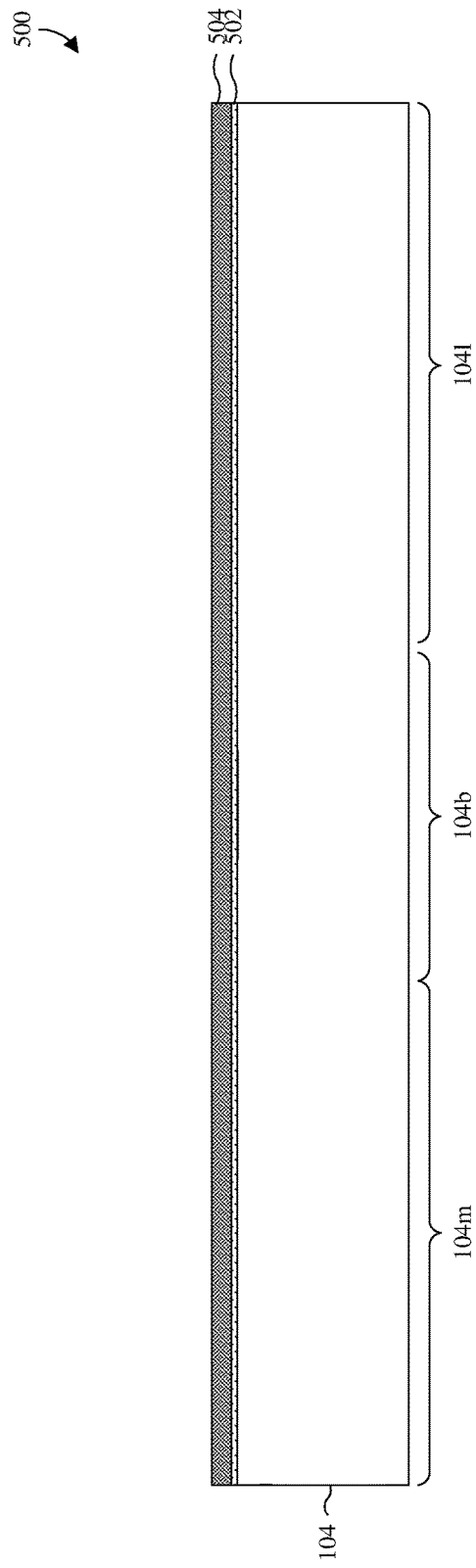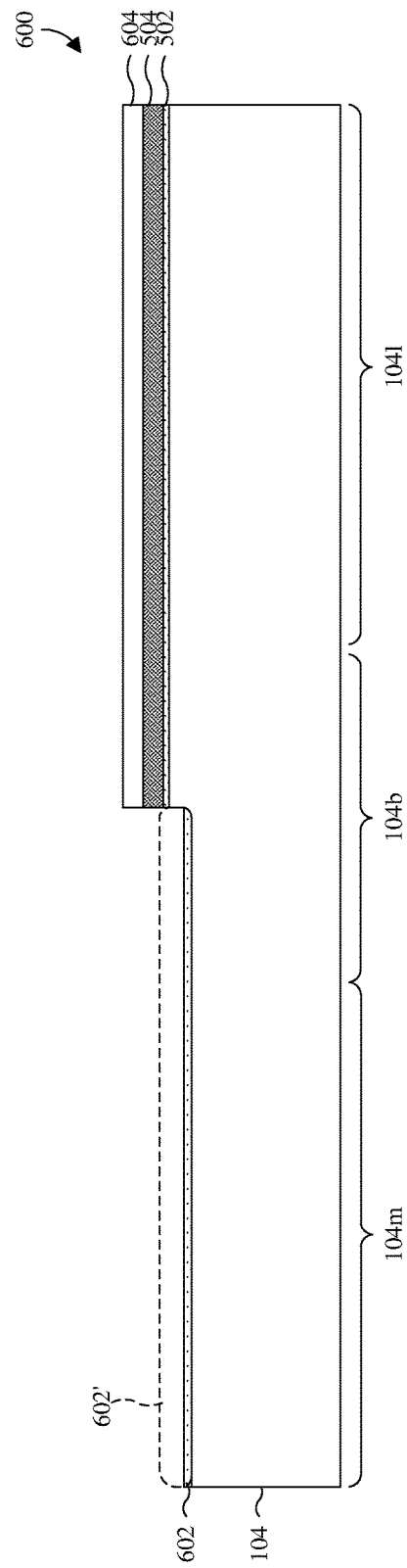
Fig. 5
Fig. 6

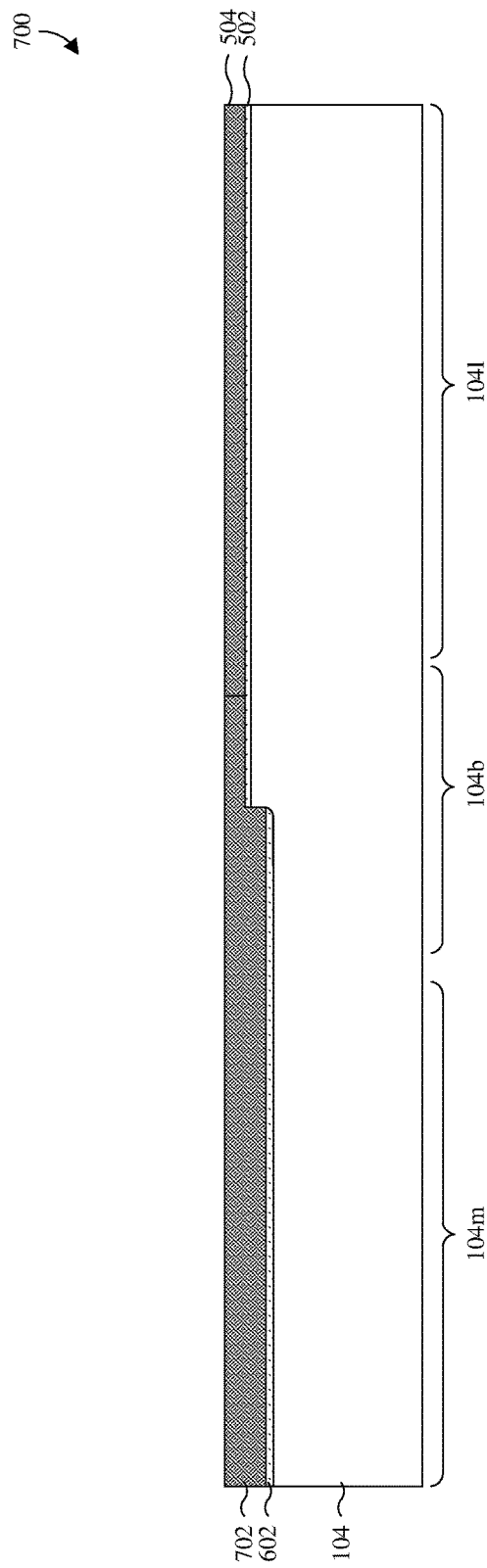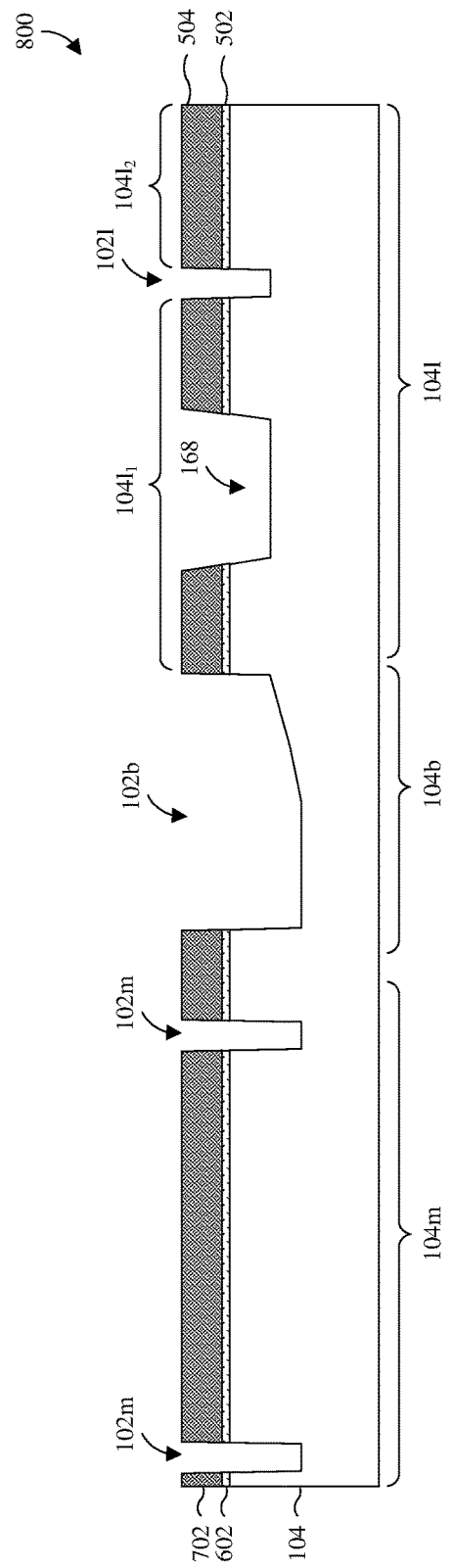
Fig. 7
Fig. 8

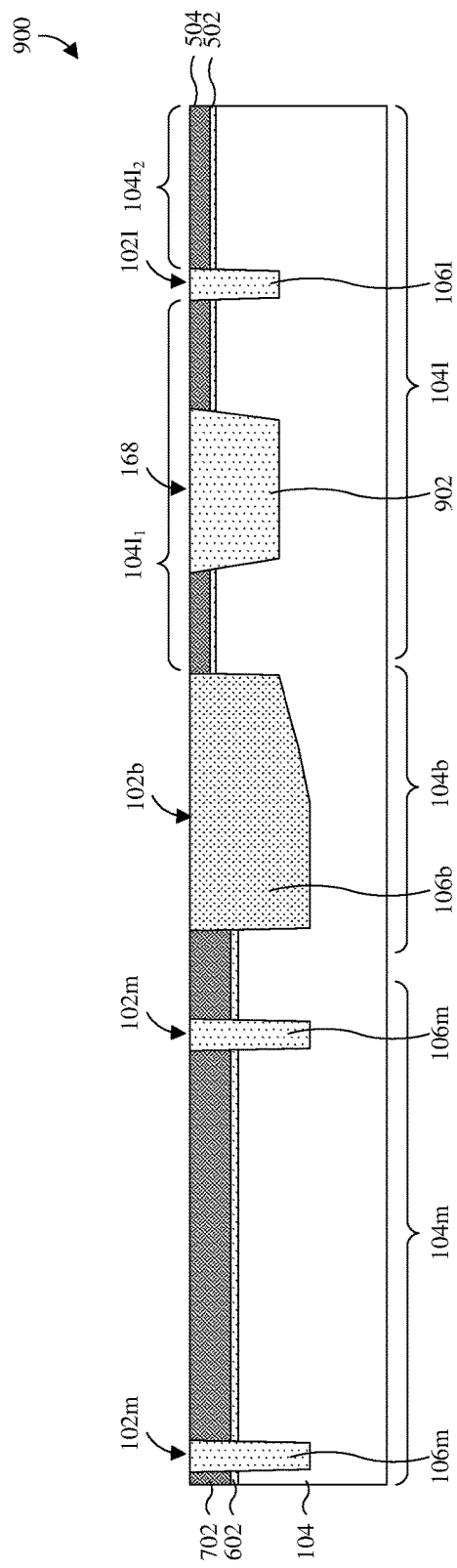
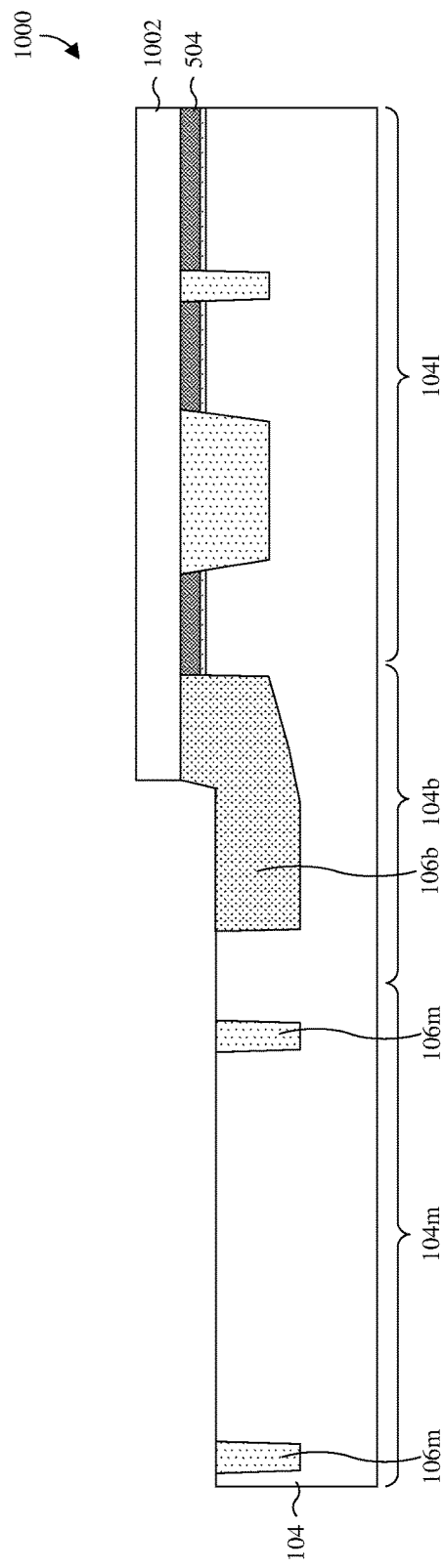
Fig. 9
Fig. 10

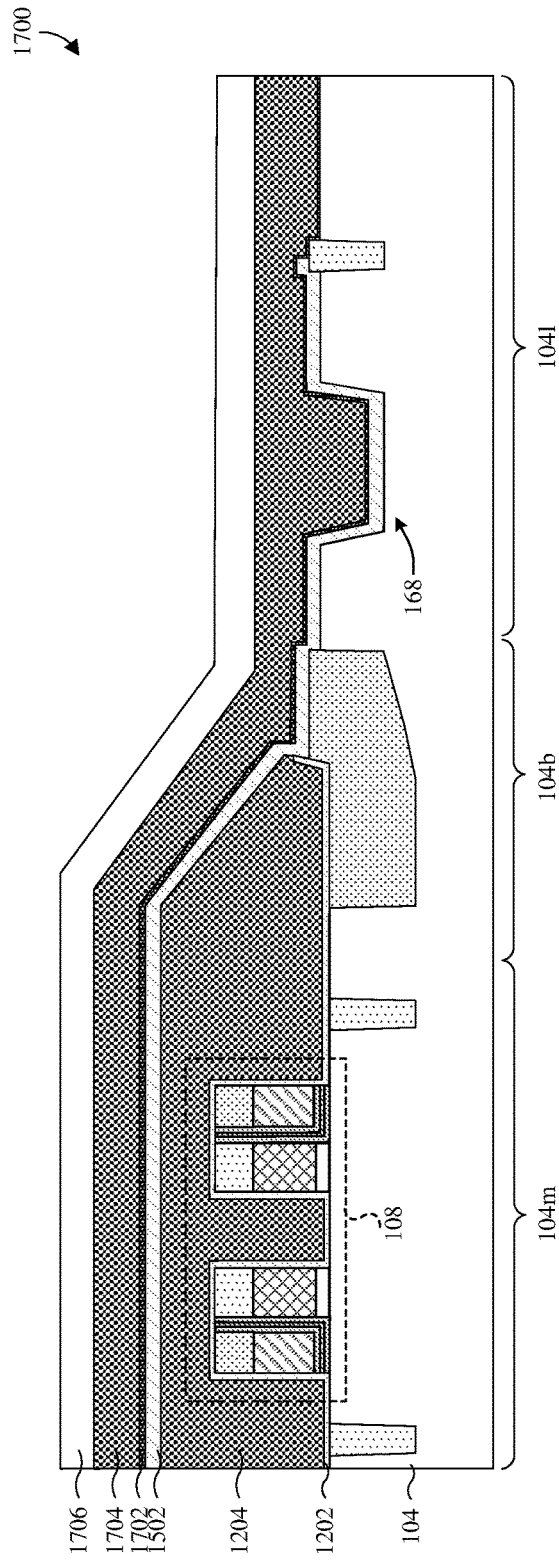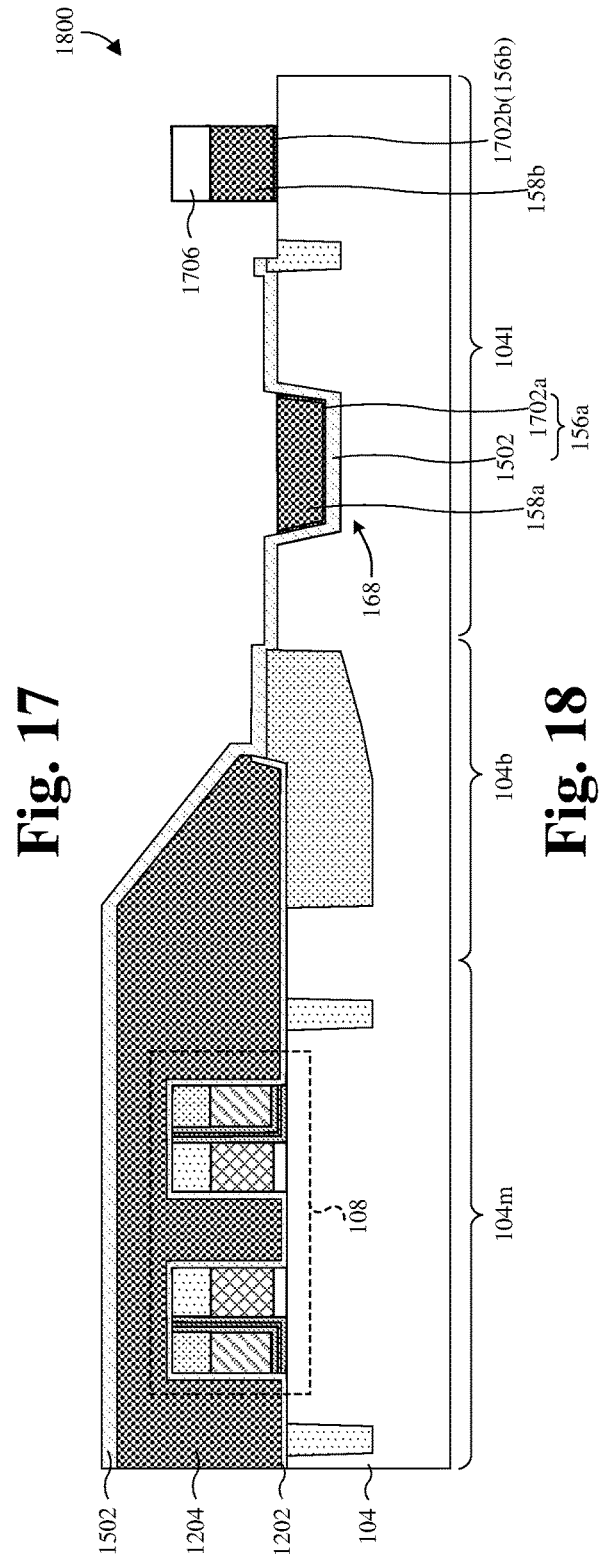
Fig. 17
Fig. 18

TRENCH GATE HIGH VOLTAGE TRANSISTOR FOR EMBEDDED MEMORY

REFERENCE TO RELATED APPLICATIONS

This Application is a Continuation of U.S. application Ser. No. 17/533,339, filed on Nov. 23, 2021, which is a Continuation of U.S. application Ser. No. 16/404,983, filed on May 7, 2019 (now U.S. Pat. No. 11,189,628, issued on Nov. 30, 2021), which claims the benefit of U.S. Provisional Application No. 62/689,893, filed on Jun. 26, 2018. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology and high-k metal gate (HKMG) technology. Embedded memory technology is the integration of memory devices with logic devices on the same semiconductor chip, such that the memory devices support the operation of the logic devices. High-k metal gate (HKMG) technology is the manufacture of semiconductor devices using metal gate electrodes and high-k gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-26 illustrate a series of cross-sectional views of some embodiments of a method for forming an IC comprising a trench gate structure for high voltage HKMG device.

DETAILED DESCRIPTION

Figure 1:
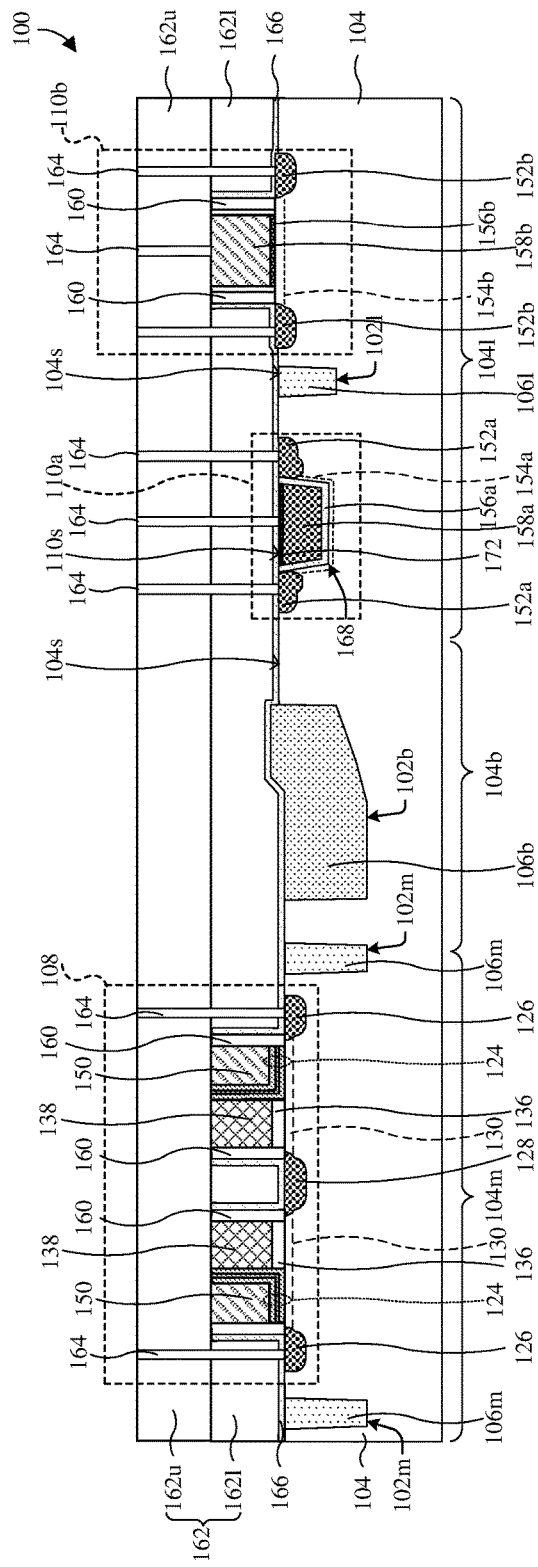
FIGS. 1-3 illustrate various cross-sectional views of some embodiments of a HKMG embedded memory integrated circuit (IC) comprising a trench gate high voltage transistor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Embedded memory is a technology that is used in the semiconductor industry to improve the performance of an integrated circuit (IC). Embedded memory is a non-stand-alone memory, which is integrated on the same chip with a logic core and which supports the logic core to accomplish an intended function. In an embedded memory IC, a plurality of different logic devices may present and operate at different voltage levels. For example, a high voltage device may be used to drive memory cells and have a relatively high operating voltage level. An input/output device may have a medium operating voltage level. And a core logic device may have a relatively low operating voltage level. In order to bear the relatively high operating voltage level, the high voltage device has larger dimensions (e.g., an enlarge device area and thicker gate dielectric), which introduce manufacturing challenges. First, the enlarged device area results in poor device height uniformity after a polishing process because of the dishing effect. Second, a thicker gate dielectric is used for the high voltage device. After even top surfaces of the devices after a planarization process, a thinner gate electrode is formed for the high voltage device. Thus, the planarization process may induce gate metal loss, which may induce sheet resistance and threshold voltage variations and mismatch issues.

In view of the foregoing, various embodiments of the present application are directed to an integrated circuit (IC) comprising a trench gate high voltage transistor and a method for forming the IC. In some embodiments, referring to FIG. 1 for example, the IC comprises a memory region 104*m* and a logic region 104*l* integrated into a substrate 104 and separated by a boundary region 104*b*. A memory cell structure 108 is disposed on the memory region 104*m*. A first logic device 110*a* and a second logic device 110*b* are disposed on the logic region 104*l*. The first logic device 110*a* comprises a first logic gate electrode 158*a* separated from the substrate 104 by a first logic gate dielectric 156*a*. The second logic device 110*b* comprises a second logic gate electrode 158*b* separated from the substrate 104 by a second logic gate dielectric 156*b*. The first logic device 110*a* is configured to operate at a first voltage greater than a second voltage of the second logic device 110*b*. The first logic gate dielectric 156*a* and the first logic gate electrode 158*a* are disposed within a logic device trench 168 of the substrate 104. Thus, a first logic channel 154*a* is established below bottom and sidewall surfaces of the logic device trench 168 with a "U" shape. Comparing to previous approaches where a gate electrode and a gate dielectric are stacked above the substrate 104 from a top surface, the lateral device area can be reduced for the same channel length. Also, by arranging the first logic gate dielectric 156a and the first logic gate electrode 158a within logic device trench 168, the top surface of the first logic gate electrode 158a is lowered (e.g. even with a top surface of the substrate 104), and thus will not limit planarization window, and will not be damaged by the planarization process. Thereby, metal layer loss and the resulted sheet resistance and threshold voltage variations and mismatch issues caused by the subsequent planarization process can be improved.

FIG. 1 shows a cross-sectional view of an IC 100 according to some embodiments. The IC 100 has a substrate 104 including a memory region 104m and a logic region 104l separated by a boundary region 104b. A memory cell structure 108 is disposed on the memory region 104m, and a first logic device 110a and a second logic device 110b are disposed on the logic region 104l. The first logic device 110a is configured to operate at a first voltage. The second logic device 110b is configured to operate at a second voltage smaller than the first voltage. In some embodiments, the first logic device 110a comprises a first pair of logic source/drain regions 152a disposed alongside a logic device trench 168 of the substrate 104. The first pair of logic source/drain regions 152a is heavily doped semiconductor regions having a first doping type (e.g., p-type or n-type). A first logic gate dielectric layer 156a is disposed along bottom and sidewall surfaces of the logic device trench 168. A first logic gate electrode 158a fills in a remaining space of the logic device trench 168 and overlies the first logic gate dielectric layer 156a. In some embodiments, a silicide pad 172 is formed on the first logic electrode 158a. The silicide pad 172 may be or otherwise comprise, for example, be nickel silicide or some other suitable silicide(s). Though not shown in the figure, silicide pads can also be formed on the memory source/drain regions 126, 128 and the logic source/drain regions 152a, 152b. The first logic gate electrode 158a may be or otherwise comprise a conductive material, for example, doped polysilicon or some other suitable conductive material(s). The first logic gate dielectric layer 156a may be or otherwise comprise, for example, silicon nitride, silicon oxide, a high κ dielectric, some other suitable dielectric(s), or any combination of the foregoing. As used herein and hereafter, a high κ dielectric is a dielectric with a dielectric constant κ greater than about 3.9. During operation, by applying an operation voltage, the first logic gate electrode 158a controls carries' flowing between the first pair of logic source/drain regions 152a through a first logic channel 154a. The first logic channel 154a is a doped semiconductor region having a second doping type (e.g., p-type or n-type) opposite the first doping type. By having the first logic channel 154a disposed below the bottom and sidewall surfaces of the logic device trench 168 with a "U" shape, the lateral area of the first logic device 110a is decreased, and thereby makes the IC 100 more compact. By arranging the logic gate electrode 158a and the first logic gate dielectric layer 156a within the logic device trench 168, a top surface 110s of the first logic gate electrode 158a is lowered, and thereby protected from a subsequent inter-layer dielectric formation and planarization process. In some embodiments, the top surface 110s of the logic gate electrode 158a is even or almost even with a top surface 104s of the substrate 104.

In some embodiments, the second logic device 110b comprises a second pair of logic source/drain regions 152b and a second logic channel 154b disposed within an upper-most portion of the substrate 104. A second logic gate dielectric layer 156b overlies the second logic channel 154b, and a second logic gate electrode 158b overlies the second logic gate dielectric layer 156b. The second logic gate electrode 158b may comprise metal. The second logic gate electrode 158b may also be or otherwise comprise other conductive material, for example, doped polysilicon or some other suitable conductive material(s). The second logic gate dielectric layer 156b may be or otherwise comprise, for example, silicon nitride, silicon oxide, a high κ dielectric, some other suitable dielectric(s), or any combination of the foregoing. The second logic gate dielectric layer 156b may have a thickness smaller than that of the first logic gate dielectric layer 156a. In some embodiments, a main sidewall spacer 160 lines sidewall surfaces of the second logic gate electrode 158b and the second logic gate dielectric layer 156b. The main sidewall spacers 160 may be or otherwise comprise, for example, silicon nitride, silicon oxide, or some other suitable dielectric(s). The first and second logic devices 110a, 110b may each be, for example, an IGFET, a MOSFET, a DMOS device, a BCD device, some other suitable transistor device(s), or some other suitable semiconductor device(s).

Further, in some embodiments, a contact etch stop layer (CESL) 166 is disposed along the top surface 104s of the substrate 104, covering the top surface 110s of the first logic device 110a, extending upwardly along sidewall surfaces of the main sidewall spacer 160 and separated from the sidewall surface of the second logic gate electrode 158b by the main sidewall spacer 160 within the logic region 104l. An inter-layer dielectric (ILD) layer 162 is disposed on the contact etch stop layer (CESL) 166, filled between and overlying the memory cell structure 108, the first logic device 110a and the second logic device 110b, and covers the first logic device 110a and the second logic device 110b. The inter-layer dielectric (ILD) layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9. Further yet, in some embodiments, contact vias 164 extend through the inter-layer dielectric (ILD) layer 162 to the first and second logic source/drain regions 152a, 152b and the first and second logic gate electrodes 158a, 158b. The contact vias 164 are conductive and may be or otherwise comprise, for example, tungsten, aluminum copper, aluminum, some other suitable metal(s), or some other suitable conductive material(s).

In some embodiments, the inter-layer dielectric (ILD) layer 162 may comprise a plurality of dielectric layers made of same or different materials. For example, the inter-layer dielectric (ILD) layer 162 may comprise a lower ILD layer 162l and an upper ILD layer 162u stacked one on another. The lower ILD layer 162l may have a top surface even with that of the memory cell structure 108 and/or the second logic device 110b. The even top surfaces may be achieved by a planarization process (which can be referred to in FIG. 23 as an example of the manufacturing process). The first logic device 110a, however, has a top surface lower than the top surface of the lower ILD layer 162l, and in some embodiments, even or substantially even with a top surface of the substrate 104. In this way, the first logic device 110a will not be damaged by the said planarization process.

The substrate 104 may comprise, for example, a bulk silicon substrate, a group III-V substrate, a silicon-on-insulator (SOI) substrate, or some other suitable semiconductor substrate(s). In some embodiments, the memory cell structure 108 comprises a pair of individual memory source/drain regions 126 and a common memory source/drain region 128 separated by a pair of memory channels 130. For ease of illustration, for components sharing a numeral, only one or some of the components are labeled, and some other components that have the same shading, the symmetrical location, and/or repeated structures may not be labeled. For example, only one of the pair of memory channels 130 is labeled 130, but a dash-line symmetrical to the labeled memory channel 130 along the common memory source/drain region 128 represents the other of the pair of memory channels. The individual memory source/drain regions 126 and the common memory source/drain region 128 are doped semiconductor regions having a first doping type (e.g., p-type or n-type). The memory channels 130 are doped semiconductor regions having a second doping type (e.g., p-type or n-type) opposite the first doping type.

A pair of select gate electrodes 138, a pair of control gate dielectric layers 136, a pair of charge trapping layers 124, and a pair of memory/control gate electrodes 150 are stacked on the memory channels 130. The charge trapping layer 124 is disposed between the memory/control gate electrode 150 and the select gate electrode 138. In some embodiments, the charge trapping layer 124 may comprise a tri-layer structure. For example, in some embodiments, the tri-layer structure may comprise an ONO structure having a first dielectric layer (e.g. a silicon dioxide layer), a nitride layer (e.g. a silicon nitride layer) contacting the first dielectric layer, and a second dielectric layer (e.g. a silicon dioxide layer) contacting the nitride layer. In other embodiments, the tri-layer structure may comprise an oxide-nano-crystal-oxide (ONCO) structure having a first oxide layer, a layer of crystal nano-dots (e.g. silicon dots) contacting the first oxide layer, and a second oxide layer contacting the first oxide layer and the layer of crystal nano-dots. In some embodiments, the main sidewall spacer 160 has components disposed along sidewalls of the select gate electrodes 138 and the memory/control gate electrodes 150. During operation, charges (e.g. electrons) can be injected to the charge trapping layer 124 through the source/drain regions 126 to program the memory cell structure 108. A low voltage is applied to the memory/control gate electrode 150 helps to minimize drain current and leads to a relatively small programming power. A high voltage is applied to the select gate electrode 138 which attracts or repels electrons to or from the charge trapping layer 124, yielding a high injection or removal efficiency. The select gate electrodes 138 and the memory/control gate electrodes 150 may be or otherwise comprise, for example, doped polysilicon, metal, or some other suitable conductive material(s). The control gate dielectric layers 136 may be or otherwise comprise, for example, silicon oxide or some other suitable dielectric(s).

The memory cell structure 108 may be or otherwise comprise, for example, third generation embedded super flash (ESF3) memory, first generation embedded super flash (ESF1) memory, silicon-oxide-nitride-oxide-silicon (SONOS) memory, metal-oxide-nitride-oxide-silicon (MONOS) memory, or some other suitable type(s) of memory.

In some embodiments, a plurality of isolation structures is disposed within the substrate 104. The isolation structures may comprise a memory isolation structure 106m disposed within a memory isolation trench 102m of the memory region 104m, a logic trench isolation structure 106l within a logic isolation trench 102l of the logic region 104l, and a boundary isolation structure 106b within a boundary trench 102b of the boundary region 104b. The first logic device 110a and the second logic device 110b are physically and electrically separated by the logic trench isolation structure 106l laterally between the first and second logic devices 110a, 110b. The plurality of isolation structures may be or otherwise comprise, for example, a shallow trench isolation (STI) structure, a deep trench isolation (DTI) structure, or some other suitable isolation structure(s). In some embodiments, the memory isolation structure 106m, the logic trench isolation structure 106l, and the boundary isolation structure 106b may extend to the same or substantially same depth of the substrate 104.

Figure 2:
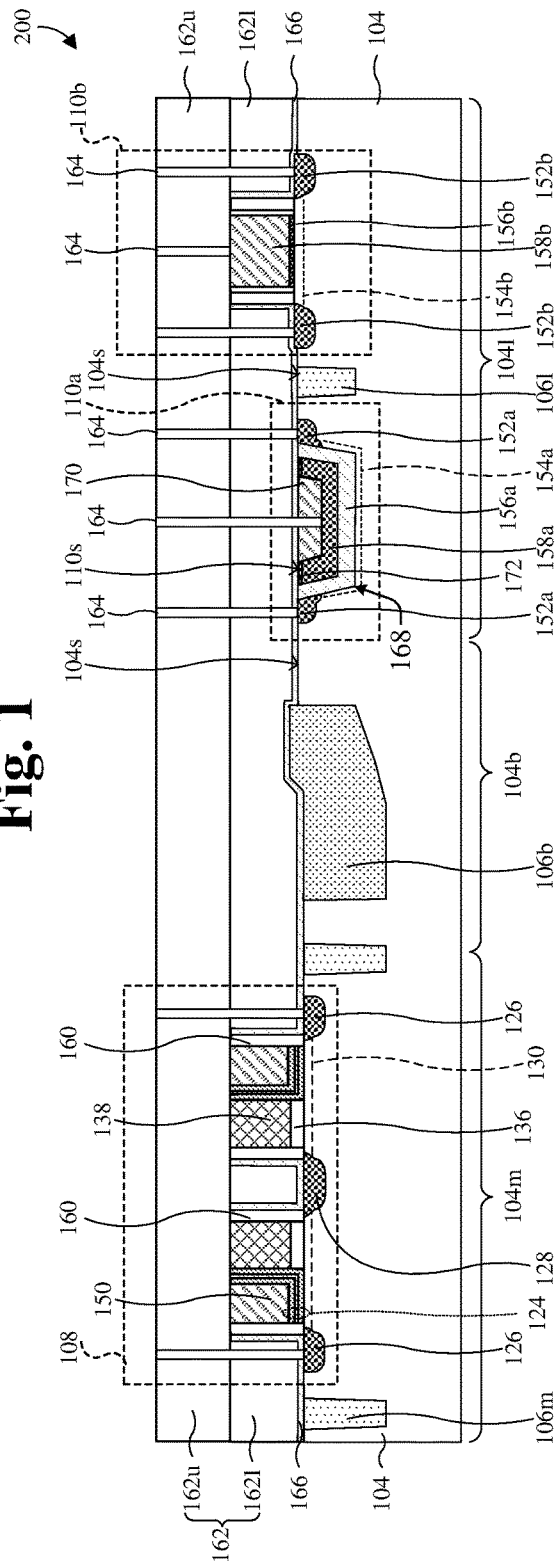

FIG. 2 illustrates a cross-sectional view of some alternative embodiments of a HKMG embedded memory integrated circuit (IC) comprising a trench gate high voltage transistor. For simplicity reason, features that are already described above associated with FIG. 1 are not repeated here. In FIG. 1, a channel length of the first logic device 110a (i.e., the length of the first logic channel 154a) may be smaller than a sum of a thickness of the conductive material that forms the first logic gate electrode 158a and twice of the depth of the logic device trench 168, and thus the first logic gate electrode 158a and the first logic gate dielectric 156a fully filled the logic device trench 168 of the substrate 104. Comparing to what is shown in FIG. 1, in FIG. 2, a channel length of the first logic device 110a may be greater than a sum of the thickness of the conductive material of the first logic gate electrode 158a and twice of the depth of the logic device trench 168. The first logic gate dielectric 156a and the first logic gate electrode 158a may not fully fill the logic device trench 168 of the substrate 104. A hard mask layer 170 is disposed on the first logic gate electrode 158a and fills in the remaining space of the logic device trench 168. In some embodiments, the hard mask layer 170 may have a top surface even with the top surface 104s of the substrate 104 and/or the top surface 110s of the first logic gate electrode 158a. The hard mask layer 170 may be or otherwise comprise a dielectric material such as silicon nitride, silicon carbide, some other suitable dielectric(s), or any combination of the foregoing.

Figure 3:
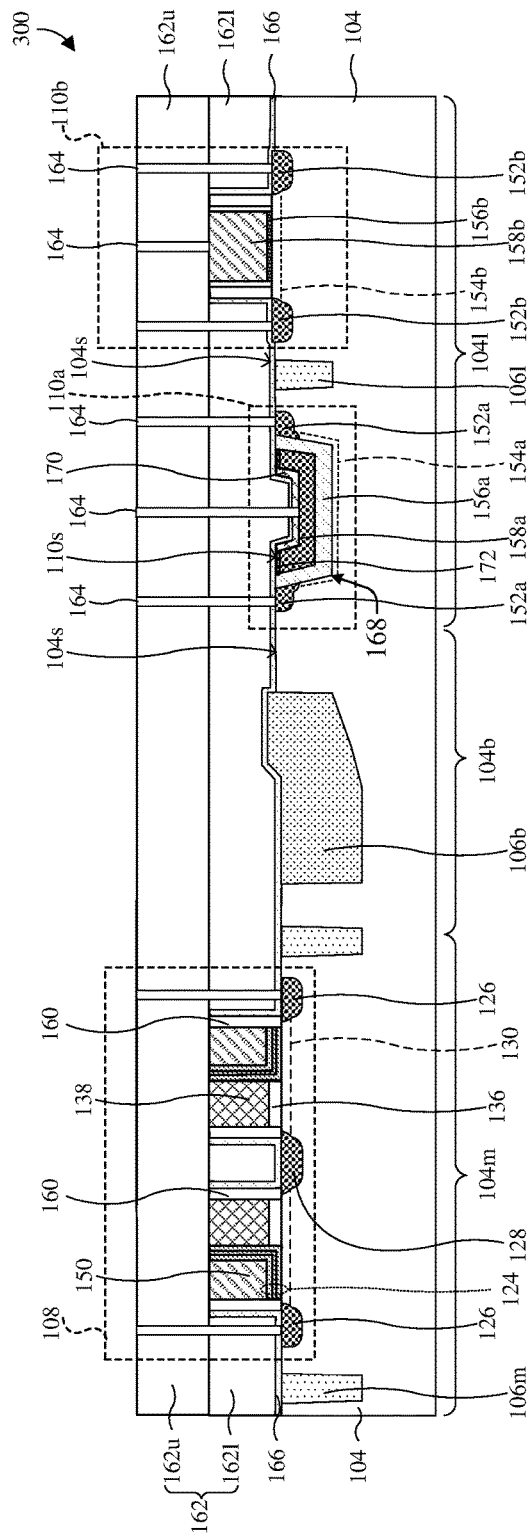

FIG. 3 illustrates a cross-sectional view of some alternative embodiments of a HKMG embedded memory integrated circuit (IC) comprising a trench gate high voltage transistor. For simplicity reason, features that are already described above associated with FIG. 1 and FIG. 2 are not repeated here. Comparing to what is shown in FIG. 1, in FIG. 3, a channel length of the first logic device 110a may be greater than a sum of the thicknesses of the hard mask layer 170, the thickness of the conductive material that forms the first logic gate electrode 158a, and twice of the depth of the logic device trench 168. The first logic gate dielectric 156a, the first logic gate electrode 158a, and the hard mask layer 170 may not fully fill the logic device trench 168 of the substrate 104. The contact etch stop layer (CESL) 166 and/or the inter-layer dielectric (ILD) layer 162 is disposed on the hard mask layer 170 and fills in the remaining space of the logic device trench 168.

Figure 4:
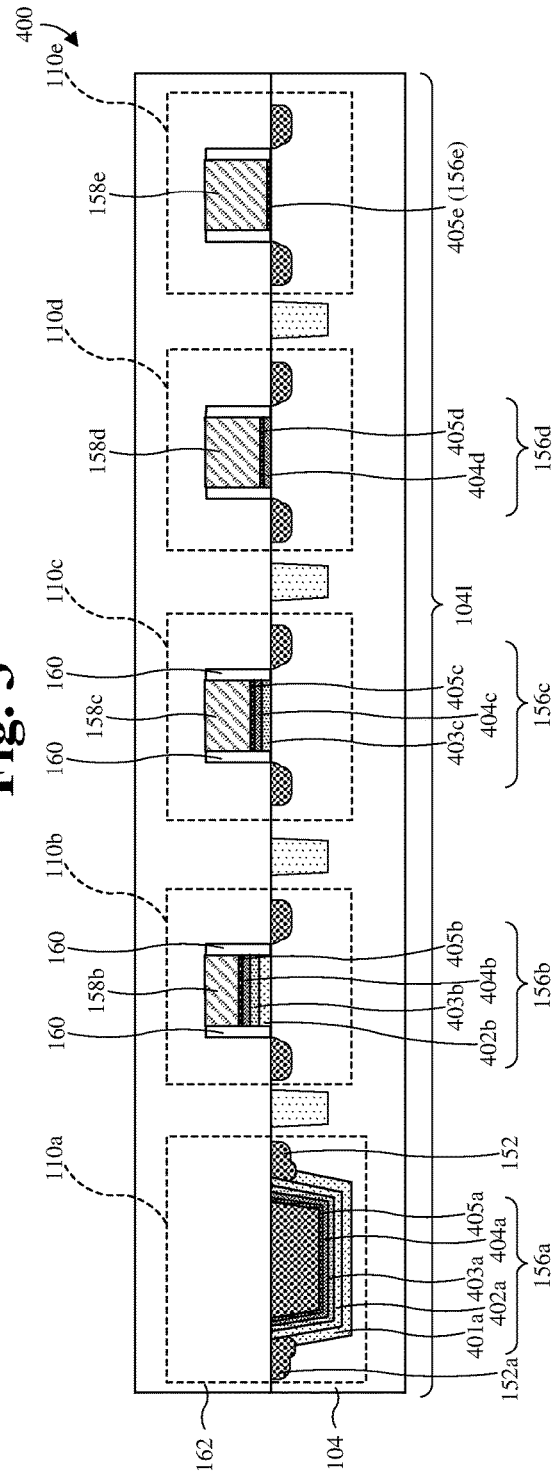
FIG. 4 illustrates a cross-sectional view of some embodiments of an integrated circuit (IC) comprising a trench gate high voltage transistor.

The plurality of logic devices in the logic region 104l discussed above associated with FIGS. 1-3 may comprise a variety of logic devices having different dimensions and operating voltages. FIG. 4 illustrates a cross-sectional view of an example of these logic devices. As shown in FIG. 4, besides the first logic device 110a and the second logic device 110b described above, a third logic device 110c, a fourth logic device 110d, and a fifth logic device 110e are disposed on the logic region 104l of the substrate 104. As an example for illustration but non-limiting purpose, the first logic device 110a can represent a high-voltage device configured to drive the memory cell structure 108 in the memory region 104m (referring to FIGS. 1-3). The second logic device 110b can represent an analog device. The third logic device 110c can represent an input/output device. The fourth logic device 110d can represent a word line device. The fifth logic device 110e can represent a core logic device. The operation voltages of the first, second, third, fourth and fifth logic devices 110a, 110b, 110c, 110d and 110e decrease in the order, and so are the thicknesses of the corresponding gate dielectrics. From bottom to top, the first gate dielectric 156a of the first logic device 110a comprises a first portion 401a of a first oxide layer, a first portion 402a of a second oxide layer, a first portion 403a of a third oxide layer, a first portion 404a of a fourth oxide layer, and a first portion 405a of a fifth oxide layer. The second logic gate dielectric 156b of the second logic device 110b comprises a second portion 402b of the second oxide layer, a second portion 403b of the third oxide layer, a second portion 404b of the fourth oxide layer, and a second portion of 405b of the fifth oxide layer. The third gate dielectric 156c of the third logic device 110c comprises a third portion 403c of the third oxide layer, a third portion 404c of the fourth oxide layer, and a third portion 405c of the fifth oxide layer. The fourth gate dielectric 156d of the fourth logic device 110d comprises a fourth portion 404d of the fourth oxide layer and a fourth portion 405d of the fifth oxide layer. The fifth gate dielectric 156e of the fifth logic device 110e comprises a fifth portion 405e of the fifth oxide layer. The portions of each of the oxide layers (i.e. the first, second, third, fourth, or fifth oxide layer) have the same composition and thickness. In some embodiments, though not shown in the figure, a high κ dielectric layer is disposed on top of the gate dielectrics, directly below the corresponding logic gate electrodes 158a, 158b, 158c, 158d, or 158e.

With reference to FIGS. 5-26, a series of cross-sectional views 500-2600 illustrates some embodiments of a method for forming an IC comprising a trench gate high voltage transistor.

As illustrated by the cross-sectional view 500 of FIG. 5, a substrate 104 is prepared including a memory region 104m and a logic region 104l connected by a boundary region 104b. In some embodiments, a lower pad layer 502 is formed covering the substrate 104, and an upper pad layer 504 is formed covering the lower pad layer 502. The lower pad layer 502 and the upper pad layer 504 are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The lower pad layer 502 may, for example, be formed of silicon oxide or some other suitable dielectric(s), and/or the upper pad layer 504 may, for example, be formed by silicon nitride or some other suitable dielectric(s).

As illustrated by the cross-sectional view 600 of FIG. 6, the substrate 104 is recessed within the memory region 104m and a memory dielectric layer 602 is formed within the memory region 104m. In some embodiments, the upper pad layer 504 is patterned (according to a masking layer 604) to form an opening corresponding to the memory region 104m and to cover a logic region 104l. A precursor layer 602' is formed from a top surface of the substrate 104, and thus reduces a height of the top surface of the substrate 104 within the memory region 104m. In some embodiments, the precursor layer 602' is an oxide layer and formed by a wet process or a thermal process. The precursor layer 602' is subsequently partially removed and a lower remaining portion of the precursor layer 602' forms the memory dielectric layer 602.

As illustrated by the cross-sectional view 700 of FIG. 7, a memory pad layer 702 is formed on the memory dielectric layer 602 within the memory region 104m. The memory pad layer 702 may be formed by depositing a dielectric material covering the memory region 104m, the logic region 104l, and the boundary region 104b. Then a planarization process is performed and may remove the memory pad layer 702 within the logic region 104l. The memory dielectric layer 602 may, for example, be formed of silicon oxide or some other suitable dielectric(s), and/or the memory pad layer 702 may, for example, be formed by silicon nitride or some other suitable dielectric(s).

As illustrated by the cross-sectional views 800-900 of FIGS. 8-9, a plurality of isolation structures is formed within the substrate 104. In FIG. 8, an etching process is performed to form a plurality of trenches extending into the substrate 104, including a memory isolation trench 102m within the memory region 104m, a boundary trench 102b within the boundary region 104b, a logic device trench 168 within a first logic region 104$l_1$, and a logic isolation trench 102l within the logic region 104l and separating the first logic region 104$l_1$ and a second logic region 104$l_2$. The first logic region 104$l_1$ may, for example, support high voltage logic devices formed hereafter, whereas the second logic region 104$l_2$ may, for example, support core logic devices formed hereafter. The high voltage logic devices may, for example, be logic devices configured to operate at higher voltages (e.g., an order of magnitude higher) than the core logic devices. In some embodiments, a process for performing the etching process comprises forming and patterning a masking layer (e.g. a photoresist layer not shown in the figure) on the upper pad layer 504 and the memory pad layer 702 with a layout of the plurality of isolation structures. An etchant is then applied to the memory pad layer 702, the memory dielectric layer 602, the upper pad layer 504, the lower pad layer 502, and the substrate 104 with the masking layer in place until the etchant reaches a desired depth of the substrate 104, and the masking layer is thereafter removed. In some embodiments, the memory isolation structure 106m, the logic trench isolation structure 106l, and the boundary isolation structure 106b may extend to the same or substantially same depth of the substrate 104. In FIG. 9, the plurality of trenches is filled with dielectric material to form the plurality of isolation structures including a memory isolation structure 106m disposed within the memory isolation trench 102m, a boundary isolation structure 106b within the boundary trench 102b, a logic device precursor 902 within the logic device trench 168, and a logic trench isolation structure 106l within the logic isolation trench 102l. The dielectric material may, for example, be formed of silicon oxide or some other suitable dielectric material(s), and/or may, for example, be performed by CVD, PVD, sputtering, or some other suitable deposition process(es). The plurality of isolation structures may be formed by underetching the lower pad layer 502 (e.g. an oxide pad) first, followed by growing a liner oxide in the plurality of trenches. Then, the rest of the plurality of trenches is filled with a deposited oxide. Next, the excessive (deposited) oxide is removed with a planarization process. The planarization process may, for example, be performed by a chemical mechanical polish (CMP) or some other suitable planarization process(es).

Figure 11:
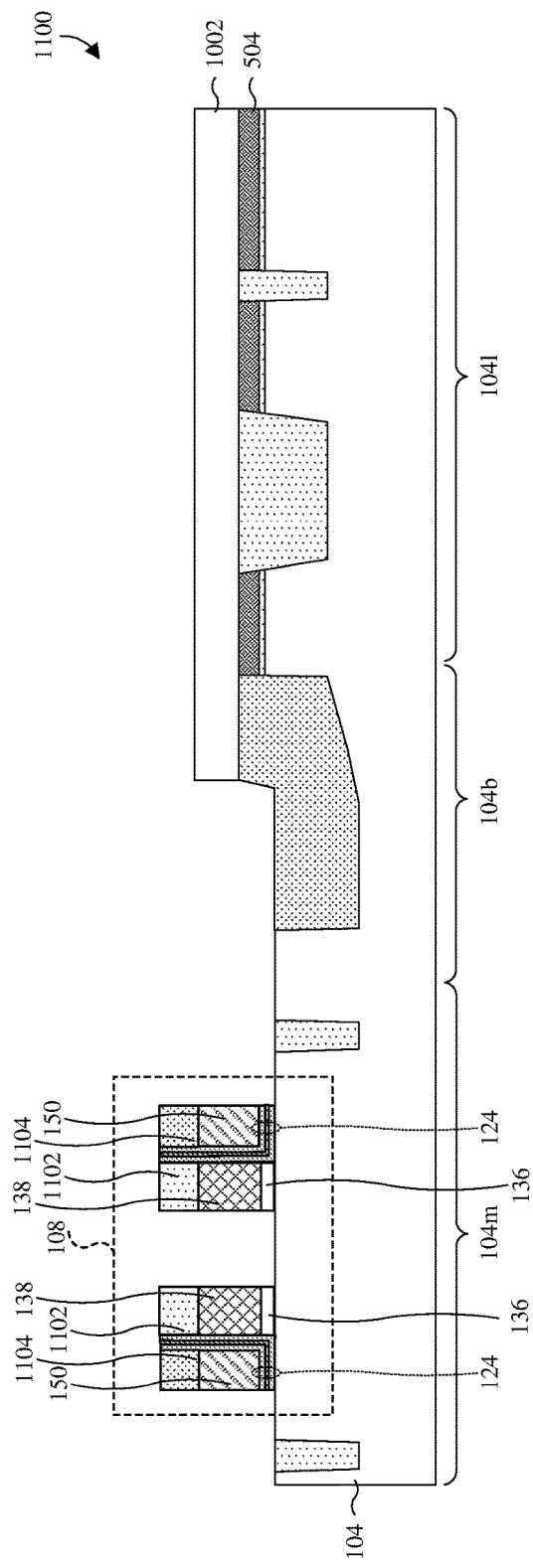

As illustrated by the cross-sectional views 1000-1100 of FIGS. 10-11, a series of manufacturing processes are performed so as a memory cell structure 108 is formed on the memory region 104m. Some of the manufacturing processes are described below as an example and not for limiting purpose. In FIG. 10, with a masking layer 1002 covering the logic region 104l and a portion of the boundary region 104b closer to the logic region 104l, an etching process is applied to remove the memory pad layer 702, the memory dielectric layer 602, and an upper portion of the memory isolation structure 106m within the memory region 104m. An upper left portion of the boundary isolation structure 106b may be removed concurrently. The etching process may comprise a series of dry and/or wet etching processes. The masking layer 1002 may be formed by photoresist. In FIG. 11, a pair of select gate electrodes 138, a pair of control gate dielectric layers 136, a pair of charge trapping layers 124, and a pair of memory/control gate electrodes 150 are formed on the substrate 104. The charge trapping layer 124 is formed between the memory/control gate electrode 150 and the select gate electrode 138. In some embodiments, a control gate hard mask 1102 and a memory gate hard mask 1104 are respectively formed on the select gate electrodes 138 and the memory/control gate electrodes 150.

Figure 12:
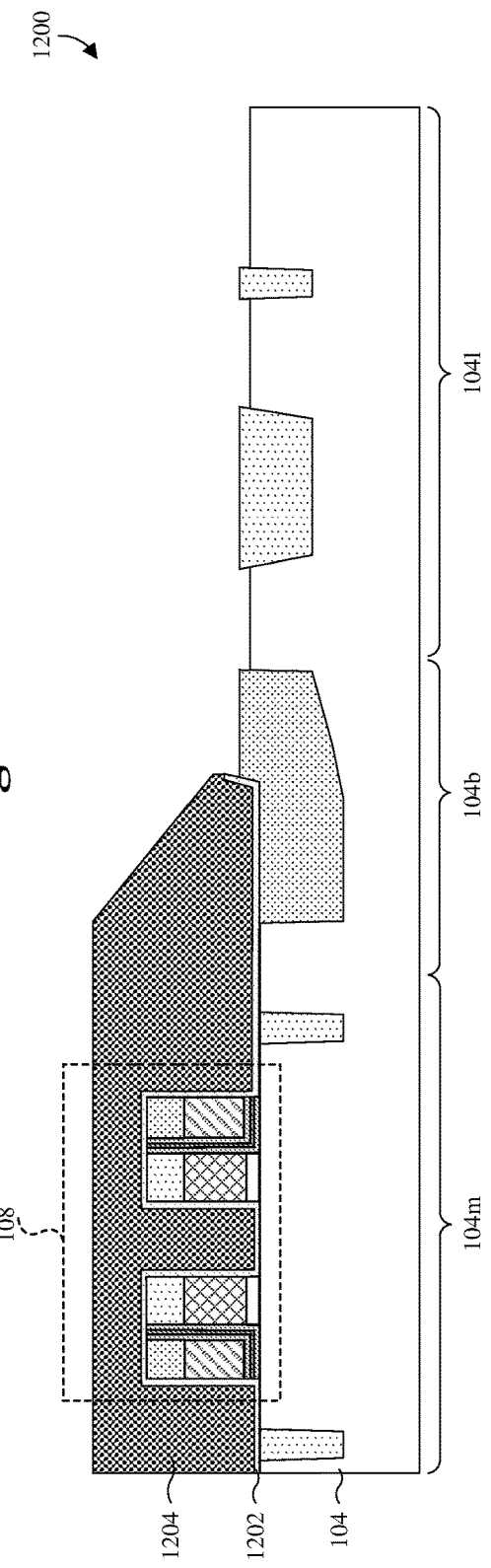

As illustrated by the cross-sectional view 1200 of FIG. 12, a dummy liner layer 1202 and a dummy capping layer 1204 are formed and patterned to cover the memory cell structure 108 and not cover the logic region 104l. The dummy liner layer 1202 may, for example, be formed conformally. In some embodiments, the dummy liner layer 1202 is formed of silicon oxide or some other suitable dielectric(s). In some embodiments, the dummy capping layer 1204 is formed of polysilicon or some other suitable material(s). Further, the dummy liner layer 1202 and/or the dummy capping layer 1204 may, for example, be formed by CVD, PVD, some other suitable deposition process(es), or any combination of the foregoing, followed by a planarization process. In some embodiments, the patterning process is performed by forming and patterning a photoresist layer (not shown) covering the memory region 104m. An etchant is then applied with the photoresist layer in place until the etchant reaches an upper surface of the substrate 104, and the photoresist layer is thereafter stripped.

Figure 13:
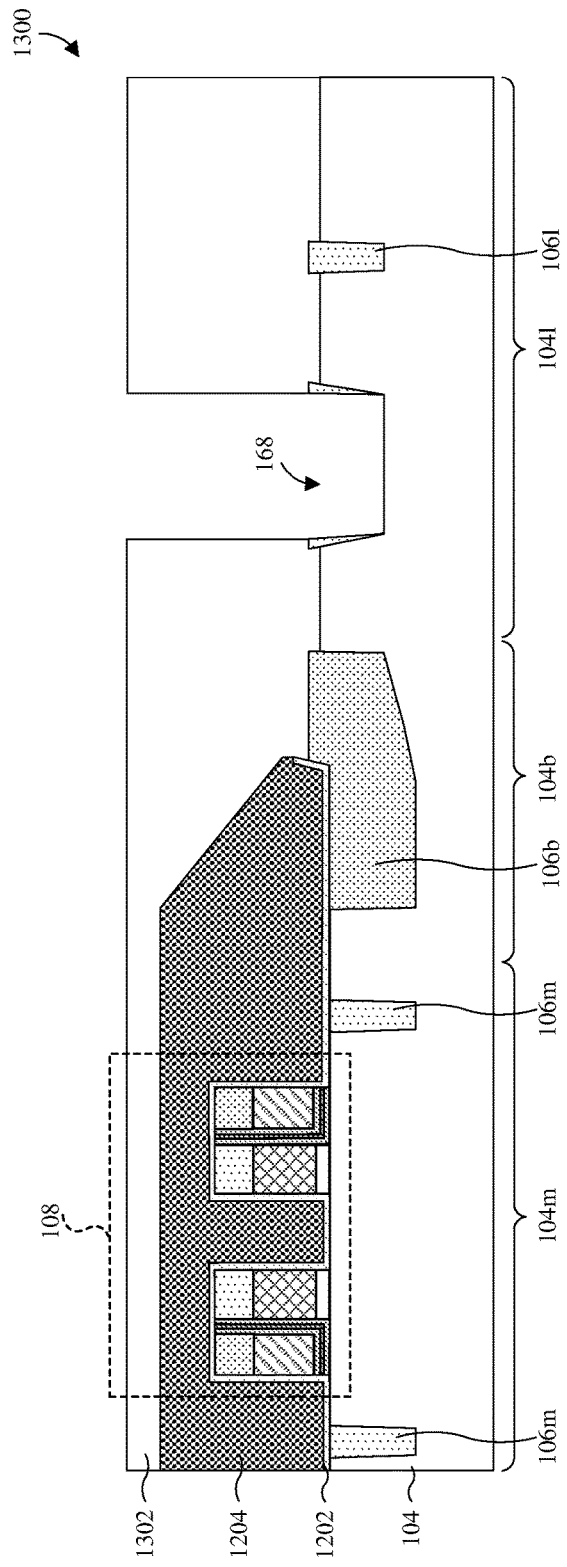
Figure 14:
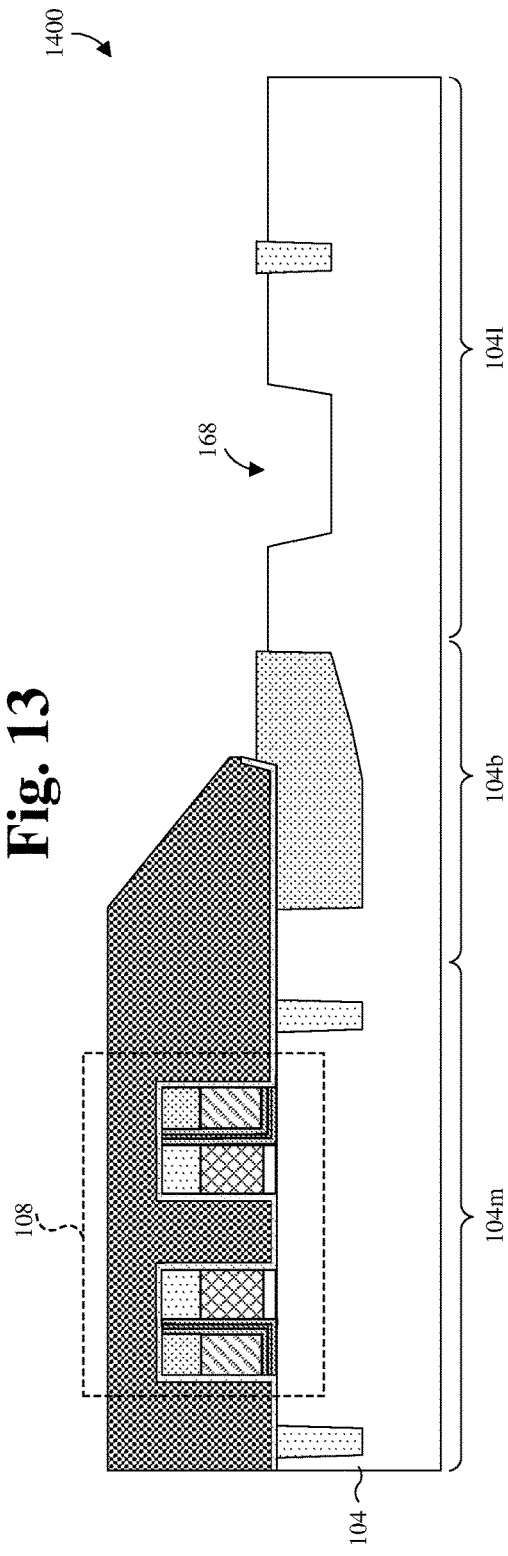

As illustrated by the cross-sectional views 1300-1400 of FIGS. 13-14, the logic device precursor 902 (referring to FIG. 9) is removed from the logic device trench 168. In FIG. 13, a masking layer 1302 is formed and patterned to expose the logic device trench 168. A dry etch is firstly performed with the masking layer 1302 in place. In FIG. 14, a wet etch is performed to remove the residue of the logic device precursor 902 (referring to FIG. 9) from the logic device trench 168.

Figure 15:
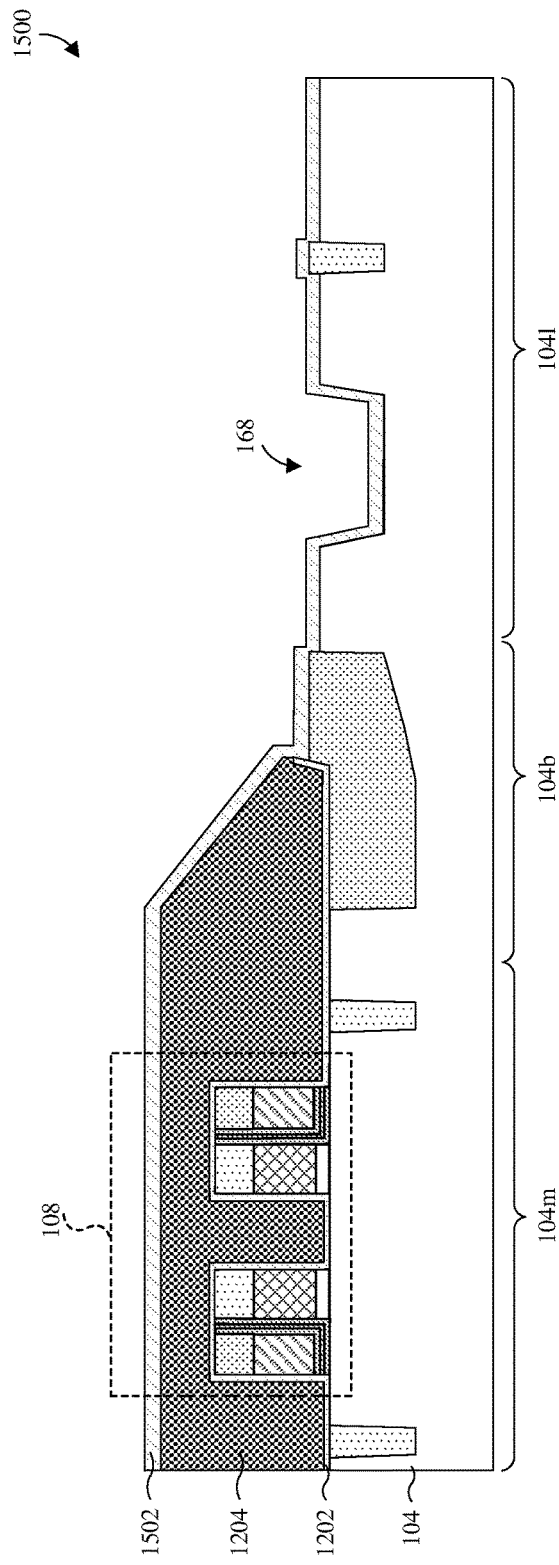
Figure 16:
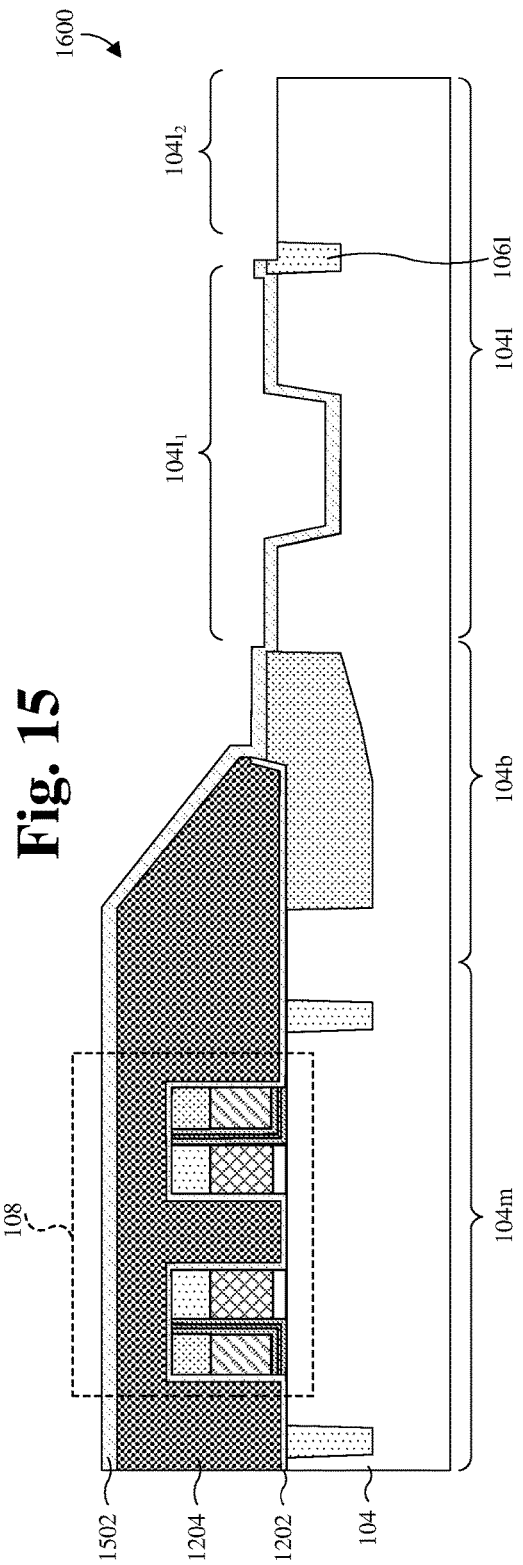

As illustrated by the cross-sectional views 1500-1600 of FIGS. 15-16, a first logic gate dielectric layer 1502 is formed and patterned. In FIG. 15, the first logic gate dielectric layer 1502 is formed along a top surface 104s of the substrate 104, extending along bottom and sidewall surfaces of the logic device trench 168. The first logic gate dielectric layer 1502 may, for example, be formed by CVD, PVD, some other suitable deposition process(es), or any combination of the foregoing. The first logic gate dielectric layer 1502 may comprise one or multiple oxide or other dielectric layers and may be formed and patterned with varies compositions and thicknesses in different logic regions of the substrate 104. In FIG. 16, the first logic gate dielectric layer 1502 is removed from the top surface of the substrate 104 within the second logic region 104$l_2$. A portion of the logic trench isolation structure 106l closer to the second logic region 104$l_2$ may also be removed as a result of an etching process. The etching process may comprise dry etching and/or wet etching.

As illustrated by the cross-sectional view 1700 of FIG. 17, a second logic gate dielectric layer 1702, a logic gate layer 1704, and a hard mask layer 1706 are formed on the first logic gate dielectric layer 1502 within the first logic region 104$l_1$, and on the substrate 104 within the second logic region 104$l_2$ in the stated order. The second logic gate dielectric layer 1702 and the logic gate layer 1704 extend into the logic device trench 168. Similar as discussed above in FIG. 2 and FIG. 3, depending on the desired device dimensions, the hard mask layer 1706 may or may not extend into the logic device trench 168, and may or may not fully filled the logic device trench 168. The second logic gate dielectric layer 1702, the logic gate layer 1704, and the hard mask layer 1706 may, for example, be formed by CVD, PVD, some other suitable deposition process(es), or any combination of the foregoing. In some embodiments, the second logic gate dielectric layer 1702 may comprise one or multiple oxide or other dielectric layers and may be formed and patterned with varies compositions and thicknesses in different logic regions of the substrate 104. The logic gate layer 1704 may comprise a conductive material, for example, doped polysilicon or some other suitable conductive material(s). The hard mask layer 1706 may be or otherwise made of, for example, silicon nitride, silicon oxide, a high κ dielectric, some other suitable dielectric(s), or any combination of the foregoing.

As illustrated by the cross-sectional view 1800 of FIG. 18, a series of etching processes are performed to the hard mask layer 1706 and the logic gate layer 1704 to form a first logic gate electrode 158a within the logic device trench 168 in the first logic region 104$l_1$ and a second logic gate electrode 158b in the second logic region 104$l_2$. The hard mask layer 1706 is patterned and formed on the second logic gate electrode 158b. The second logic gate dielectric layer 1702 is also etched and partially removed, leaving a first portion 1702a within the logic device trench 168 and a second portion 1702b underlying the second logic gate electrode 158b. In some embodiments, the first portion 1702a and the first logic gate dielectric layer 1502 collectively serve as a first logic gate dielectric 156a for the first logic gate electrode 158a, and the second portion 1702b serves as a second logic gate dielectric 156b for the second logic gate electrode 158b.

Figure 19:
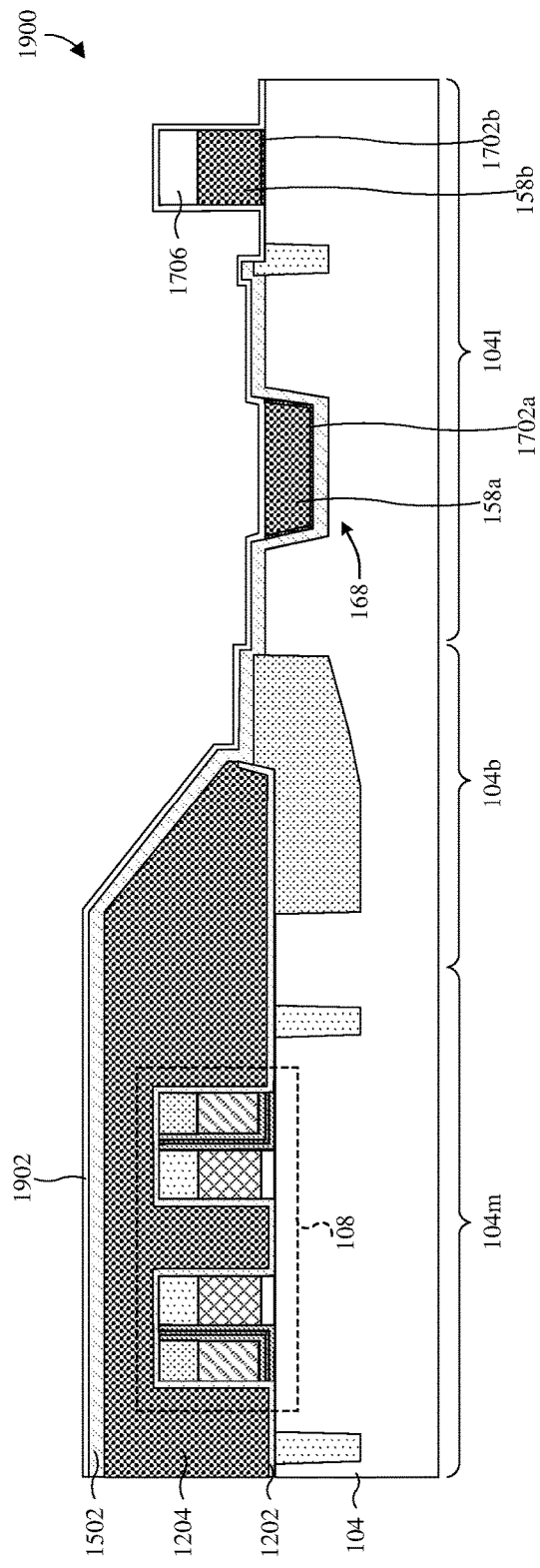

As illustrated by the cross-sectional view 1900 of FIG. 19, a sealing liner 1902 is formed covering and lining the structure of FIG. 18. The sealing liner 1902 may, for example, be deposited conformally, and/or may, for example, be formed by CVD, PVD, some other suitable deposition process(es), or any combination of the foregoing. The sealing liner 1902 may be or otherwise made of, for example, silicon nitride, silicon oxide, silicon carbide, some other suitable dielectric(s), or any combination of the foregoing.

Figure 20:
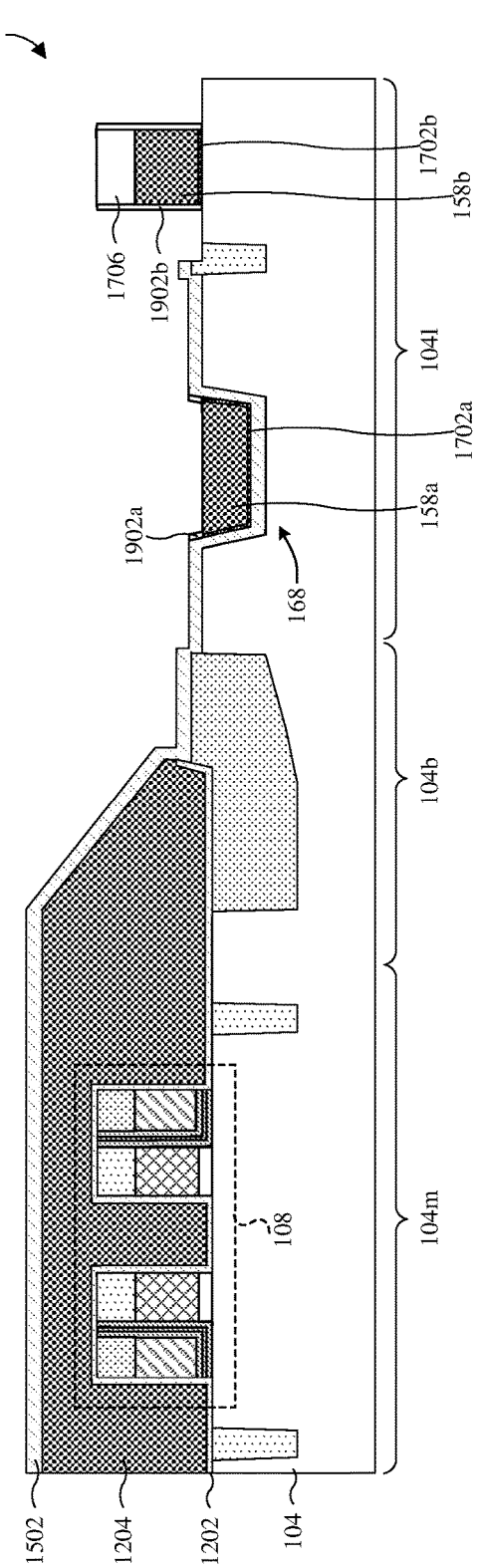

As illustrated by the cross-sectional view 2000 of FIG. 20, an etching back process is performed into the sealing liner 1902 to remove horizontal segments of the sealing liner 1902 without removing a first vertical segment 1902a on the first logic gate electrode 158a and a second vertical segment 1902b along sidewalls of the second logic gate electrode 158b. The first vertical segment 1902a and the second vertical segment 1902b may cover and seal at least the first portion 1702a and the second portion 1702b of the second logic gate dielectric layer 1702. In some embodiments, the first vertical segment 1902a is at least partially kept to the final device. In some alternative embodiments, the first vertical segment 1902a may be fully removed by the etching back process.

Figure 21:
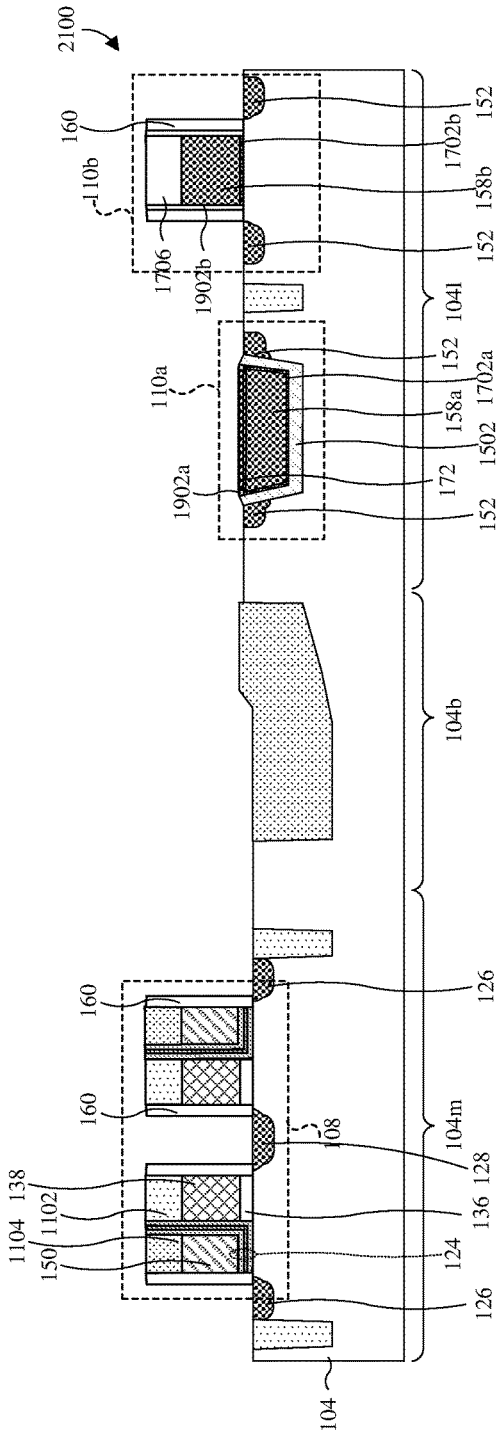

As illustrated by the cross-sectional view 2100 of FIG. 21, an etching process is performed to remove the dummy capping layer 1204 and the dummy liner layer 1202 (shown in FIG. 20) from the memory region 104m. The etching process may comprise a series of dry and/or wet etching processes. A masking layer (e.g. a photoresist layer not shown) may be used to cover and protect the logic devices 110a, 110b from etching. Individual memory source/drain regions 126 and a common memory source/drain region 128 are formed within the memory region 104m, respectively bordering the memory cell structure 108. Also, logic source/drain regions 152 are formed in pairs within the logic region 104l, with the source/drain regions of each pair respectively bordering opposite sidewalls of the logic gate electrodes 158a, 158b. In some embodiments, a process for forming the source/drain regions comprises ion implantation into the substrate 104. In other embodiments, some process other than ion implantation is used to form the source/drain regions. In some embodiments, a silicide pad 172 is formed on the first logic electrode 158a. The silicide pad 172 may be or otherwise comprise, for example, be nickel silicide or some other suitable silicide(s), and/or may, for example, be formed by a salicide process, or some other suitable growth process(es). Though not shown in the figure, silicide pads can also be formed on the individual memory source/drain regions 126 and the logic source/drain regions 152.

Also illustrated by the cross-sectional view 2100 of FIG. 21, a main sidewall spacer 160 is formed along sidewalls of the second logic gate electrode 158b within the logic region 104l and along sidewalls of the memory cell structure 108 within the memory region 104m. In some embodiments, the main sidewall spacer 160 is made of silicon oxide, silicon nitride, some other suitable dielectric(s), or any combination of the foregoing. In some embodiments, a process for forming the main sidewall spacer 160 comprises depositing a main spacer layer covering and lining the structure of FIG. 20. An etching back process is then performed into the main spacer layer to remove horizontal segments of the main spacer layer without removing vertical segments of the main spacer layer. The main spacer layer may, for example, be deposited conformally, and/or may, for example, be formed by CVD, PVD, some other suitable deposition process(es), or any combination of the foregoing. In some embodiments, the main sidewall spacer 160 is made of silicon oxide, silicon nitride, some other suitable dielectric(s), or any combination of the foregoing.

Figure 22:
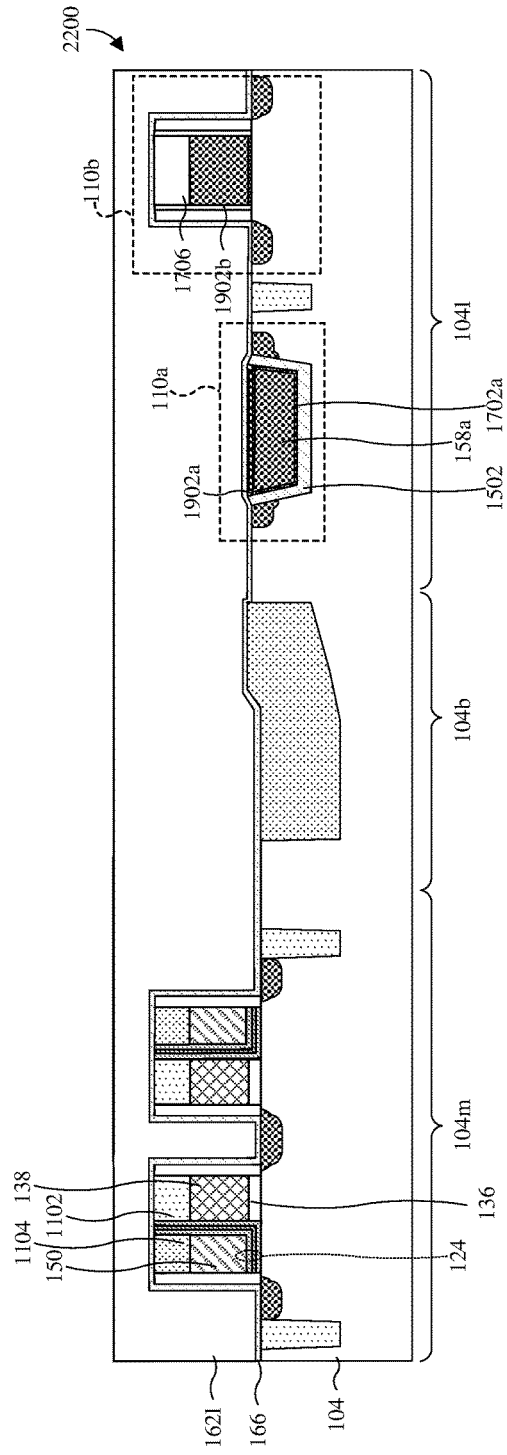

As illustrated by the cross-sectional view 2200 of FIG. 22, a contact etch stop layer (CESL) 166 and a lower inter-layer dielectric (ILD) layer 162l are formed covering the structure of FIG. 21. The lower ILD layer 162l may, for example, be deposited by CVD, PVD, sputtering, or any combination of the foregoing followed by a planarization process. The lower ILD layer 162l may, for example, be oxide, low κ dielectric, some other suitable dielectric(s), or any combination of the foregoing.

Figure 23:
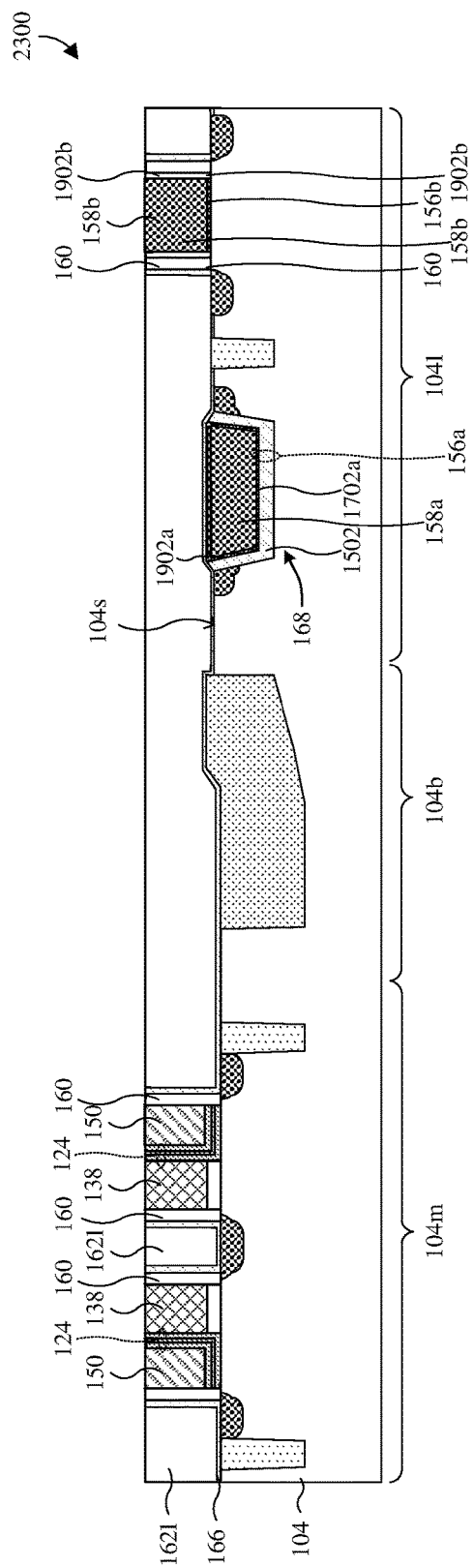

As illustrated by the cross-sectional view 2300 of FIG. 23, a planarization process is performed to the lower inter-layer dielectric (ILD) layer 162l and the contact etch stop layer (CESL) 166. The planarization process may also remove the control gate hard mask 1102, the memory gate hard mask 1104, and the hard mask layer 1706 (referring to FIG. 22) and expose the corresponding gate electrodes. The planarization process may, for example, a CMP or some other suitable planarization process(es). The lower ILD layer 162l is formed with a top surface that is planar or substantially planar with top surfaces of the remaining structure. The planarization process may, for example, a CMP or some other suitable planarization process(es). The planarization process may also recess a top surface of the lower ILD layer 162l to about even with top surfaces of the second logic gate electrode 158b, thereby exposing the second logic gate electrode 158b. As discussed associated with FIG. 18, the first logic gate dielectric 156a has a thickness greater than that of the second logic gate dielectric 156b. If the first logic gate dielectric 156a and the first logic gate electrode 158a are formed on the top surface 104s of the substrate 104, the first logic gate electrode 158a would be thinner than the second logic gate electrode 158b. Thus, the first logic gate electrode 158a could be damaged or has significant uniformity issue. By having the first logic gate dielectric 156a and the first logic gate electrode 158a recessed in the logic device trench 168, the first logic gate electrode 158a is protected from the planarization process of the lower ILD layer 162l.

Figure 24:
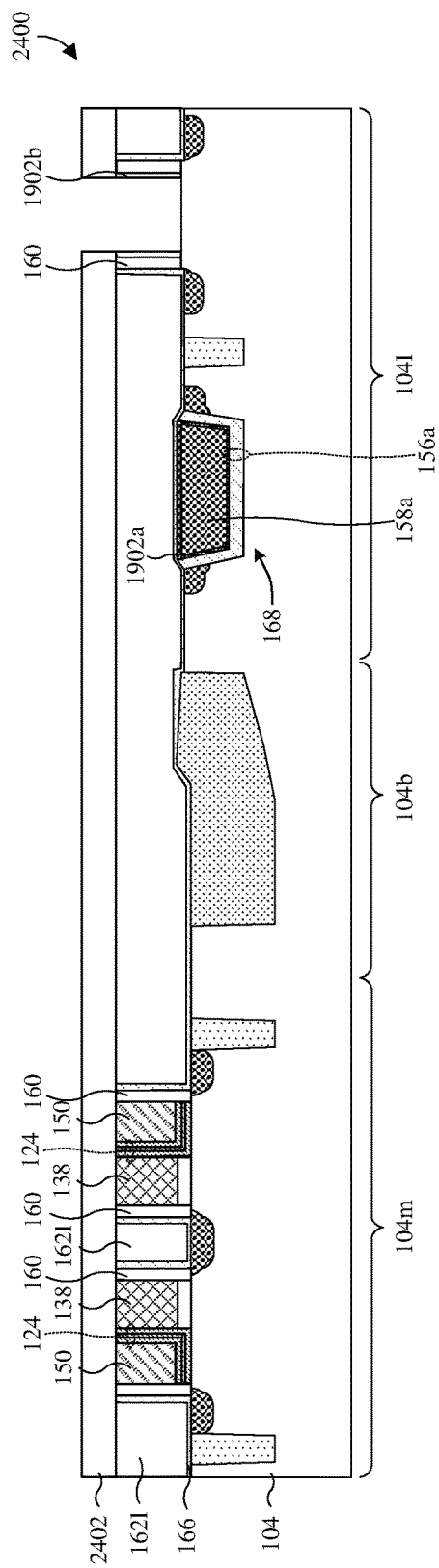
Figure 25:
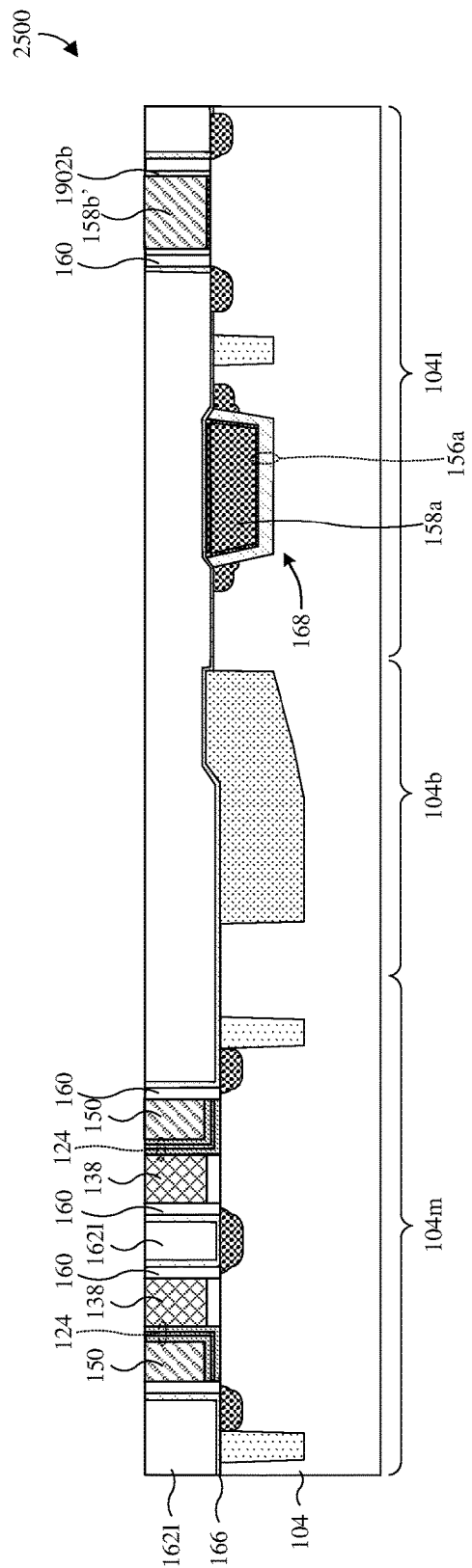

As illustrated by the cross-sectional views 2400-2500 of FIGS. 24-25, in some embodiments, a replacement gate process is then performed. In FIG. 24, an etching process is performed to remove the second logic gate electrode 158b (referring to FIG. 23). In some embodiments, the etching process is performed with a masking layer 2402 in place to protect other regions of the structure until the second logic gate electrode 158b is removed. In FIG. 25, a metal gate electrode 158b' is then formed in place of the second logic gate electrodes 158b. The metal gate electrode 158b' may, for example, be metal, a different material than the first and second logic gate electrodes 158a, 158b, or some other suitable conductive material(s). In some embodiments, a process for forming the metal gate electrode 158b' comprises forming a conductive layer by, for example, by CVD, PVD, electroless plating, electroplating, or some other suitable growth or deposition process(es). A planarization is then performed into the conductive layer until the lower ILD layer 162l is reached. The planarization may, for example, be performed by a CMP or some other suitable planarization process(es). Similar as discussed associated with FIG. 23, by having the first logic gate dielectric 156a and the first logic gate electrode 158a recessed in the logic device trench 168, the first logic gate electrode 158a is protected from the planarization process of the conductive layer.

Figure 26:
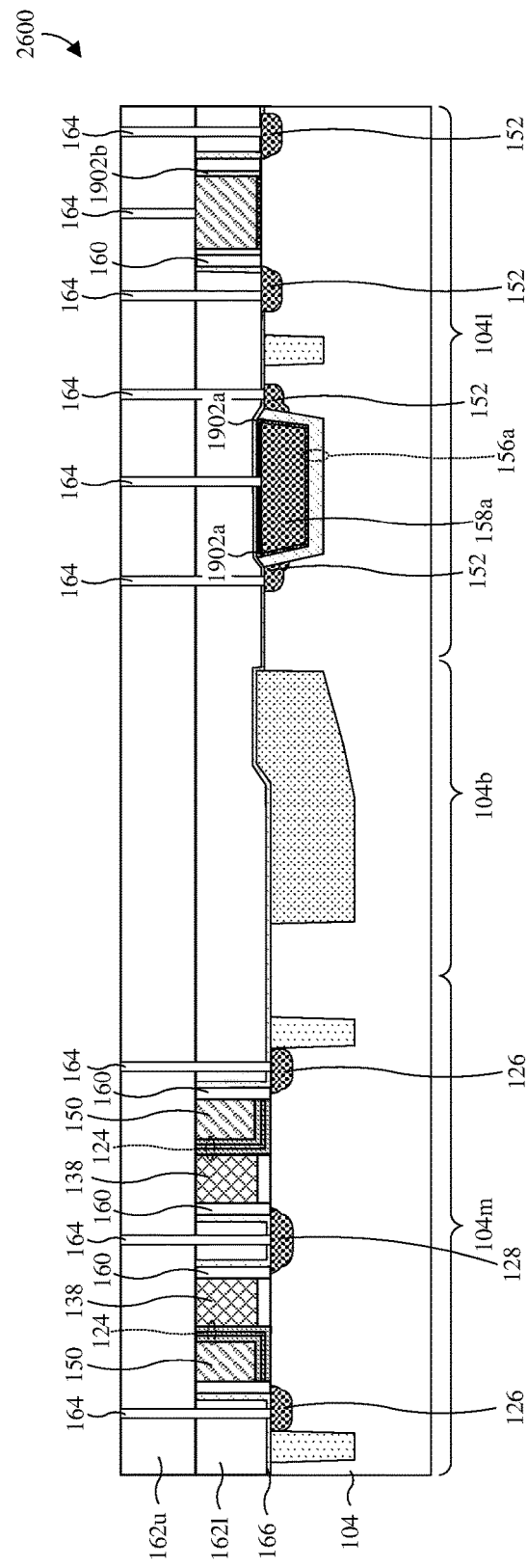

As illustrated by the cross-sectional view 2600 of FIG. 26, an upper ILD layer 162u is formed covering the structure of FIG. 25 and with a top surface that is planar or substantially planar. The upper ILD layer 162u may, for example, be oxide, a low κ dielectric, some other suitable dielectric(s), or any combination of the foregoing. Further, the upper ILD layer 162u may, for example, be formed by depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es).

Also illustrated by the cross-sectional view 2600 of FIG. 26, contact vias 164 are formed extending through the upper ILD layer 162u and the lower ILD layer 162l to the individual memory source/drain regions 126, the logic source/drain regions 152. The contact vias 164 may also be formed to couple to the common memory source/drain region 128, the select gate electrodes 138, the memory/control gate electrodes 150, the first and second logic gate electrodes 158a, 158b, or any combination of the foregoing.

Figure 27:
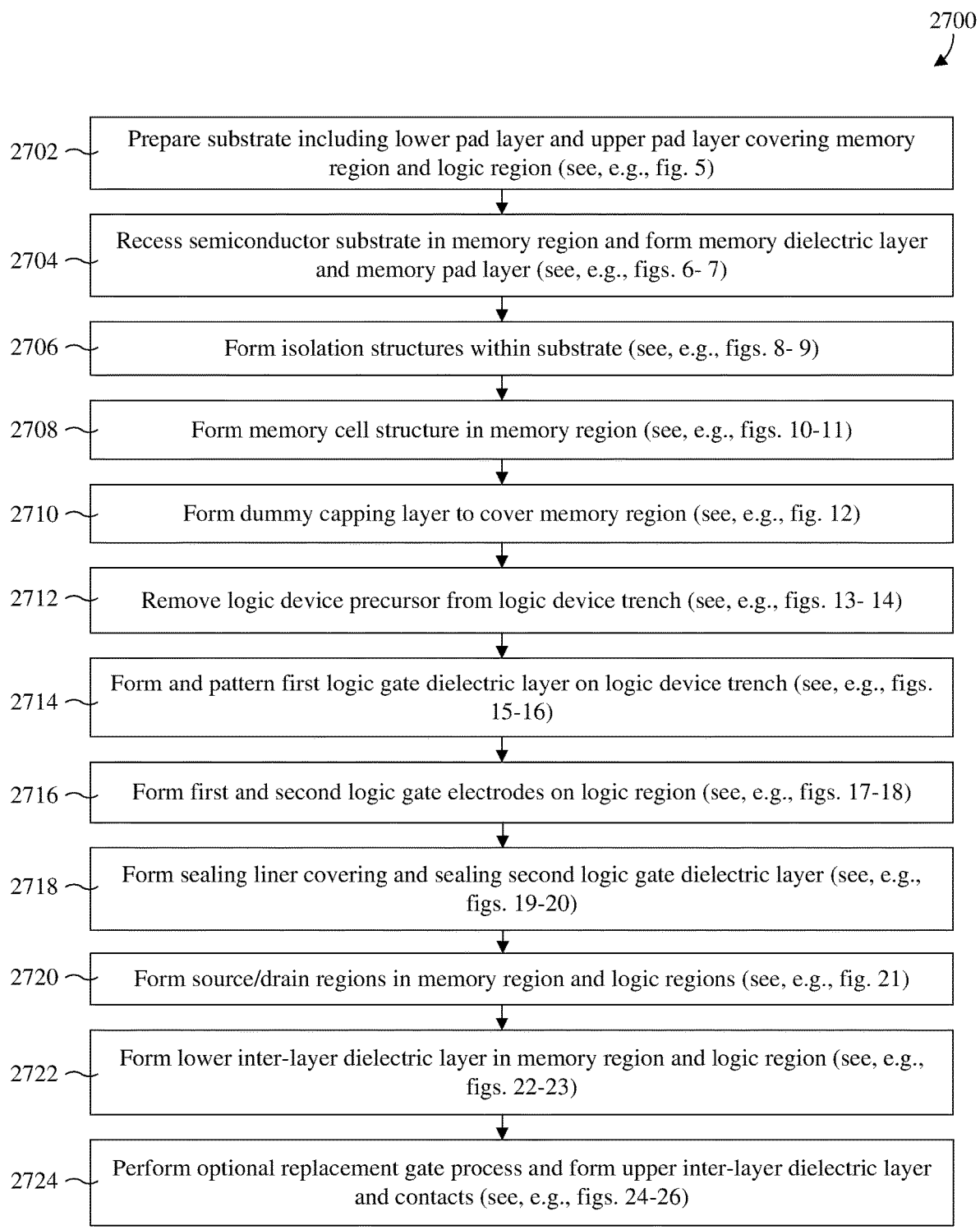
FIG. 27 illustrates a flowchart of some embodiments of the method of FIGS. 5-26.

With reference to FIG. 27, a flowchart 2700 of some embodiments of a method for forming an IC comprising a trench gate structure for high voltage HKMG device is provided. The IC may, for example, correspond to the IC of FIGS. 5-26.

At step 2702, a substrate is provided. The substrate includes a memory region and a logic region connected by a boundary region. In some embodiments, a lower pad layer is formed covering the substrate, and an upper pad layer is formed covering the lower pad layer. See, for example, FIG. 5.

At step 2704, the substrate is recessed within the memory region. A memory dielectric layer is formed within the memory region. A memory pad layer is formed on the memory dielectric layer within the memory region. See, for example, FIGS. 6-7.

At step 2706, a plurality of isolation structures is formed within the substrate. An etching process is performed to form a plurality of trenches extending into the substrate. Then, the plurality of trenches is filled with dielectric material to form the plurality of isolation structures. The plurality of isolation structures may include a memory isolation structure disposed within the memory isolation trench, a boundary isolation structure within the boundary trench, a logic device precursor within the logic device trench, and a logic trench isolation structure within the logic isolation trench. See, for example, FIGS. 8-9.

At step 2708, a memory cell structure is formed within the memory region. See, for example, FIGS. 10-11.

At step 2710, a dummy capping layer is formed in the memory covering the memory cell structures. See, for example, FIG. 12.

At step 2712, the logic device precursor is removed from the logic device trench. See, for example, FIGS. 13-14.

At step 2714, a first logic gate dielectric layer is formed and patterned within the logic device trench. See, for example, FIGS. 15-16.

At step 2716, a logic gate layer is deposited and patterned to form a first logic gate electrode within the logic device trench and a second logic gate electrode in the second logic region. See, for example, FIGS. 17-18.

At step 2718, a sealing liner is deposited and patterned to form a vertical segment in the first logic region and a second vertical segment in the second logic region covering and sealing the second logic gate dielectric layer. See, for example, FIGS. 19-20.

At step 2720, source/drain regions are in the memory region and the logic region. See, for example, FIG. 21.

At step 2722, a lower inter-layer dielectric layer is formed to fill spaces between the memory device structures in the memory region and the logic devices within the logic region. See, for example, FIGS. 22-23.

At step 2724, a replacement gate process is performed to replace the logic gate electrodes by metal gate electrodes for the logic devices within the logic region. An upper inter-layer dielectric layer is formed on the lower inter-layer dielectric layer overlying the memory device structures in the memory region and the logic devices within the logic region. Contacts can be subsequently formed. See, for example, FIGS. 24-26.

While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The IC comprises a plurality of logic devices disposed on a logic region of a substrate, including a first logic device configured to operate at a first voltage and comprising a first logic gate electrode separated from the substrate by a first logic gate dielectric. The first logic gate dielectric is disposed along sidewall and bottom surfaces of a logic device trench of the substrate, and the first logic gate electrode is disposed conformally along the first logic gate dielectric within the logic device trench. A hard mask layer is disposed on the first logic gate electrode within the logic device trench.

Further, some embodiments of the present application are directed towards an integrated circuit (IC). The IC comprises a substrate including a memory region, a logic region, and a boundary region defined between the memory region and the logic region. A first logic gate dielectric and a first logic gate electrode are disposed in a logic device trench of the logic region. A hard mask layer is disposed on the first logic gate electrode and within the logic device trench. The hard mask layer and the first logic gate electrode have top surfaces aligned with one another. First and second source/drain regions are disposed in the substrate on opposite sides of the logic device trench.

Further, some embodiments of the present application are directed towards an integrated circuit (IC). The IC comprises a logic device trench and a logic isolation trench of a substrate extending from an upper surface of the substrate to a position within the substrate. A first logic device is configured to operate at a first voltage and comprising a first logic gate electrode separated from the substrate by a first logic gate dielectric. The first logic gate dielectric and the first logic gate electrode are disposed along bottom and sidewall surfaces of the logic device trench of the substrate. A second logic device comprises a second logic gate electrode separated from the substrate by a second logic gate dielectric, wherein the second logic device is configured to operate at a second voltage smaller than the first voltage. A hard mask layer is disposed on the first logic gate electrode within the logic device trench_with an upper surface aligned with that of the first logic gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing an integrated circuit (IC), the method comprising:
providing a substrate including a memory region, a logic region, and a boundary region defined between the memory region and the logic region;
forming a plurality of deep trenches from a top surface of the substrate, including a memory isolation trench in the memory region, a logic isolation trench in the logic region, a boundary trench in the boundary region, and a logic device trench in the logic region between the logic isolation trench and the boundary trench;

filling an isolation material in the plurality of deep trenches including the memory isolation trench to form a memory isolation structure, the logic isolation trench to form a logic isolation structure, the boundary trench to form a boundary isolation structure, and the logic device trench;

removing the isolation material from the logic device trench; and forming a first logic device by filling a first logic gate dielectric and a first logic gate electrode in the logic device trench and forming first and second source/drain regions in the substrate on opposite sides of the logic device trench.

2. The method according to claim 1, wherein the first logic gate dielectric is formed along sidewall and bottom surfaces of the logic device trench.

3. The method according to claim 1, wherein the first logic gate electrode is formed conformally along the first logic gate dielectric within the logic device trench.

4. The method according to claim 1, further comprising forming a hard mask layer on the first logic gate electrode within the logic device trench.

5. The method according to claim 4, wherein the hard mask layer is made of silicon nitride or silicon carbide.

6. The method according to claim 4, further comprising forming an inter-layer dielectric (ILD) layer filling in a remaining space of the logic device trench above the hard mask layer.

7. The method according to claim 4, wherein the hard mask layer has a top surface aligned with that of the first logic gate electrode.

8. The method according to claim 1, wherein the first and second source/drain regions have top surfaces coplanar with that of the first logic gate electrode.

9. The method according to claim 1, wherein the first logic gate dielectric is formed with a stack of oxide layers and a high κ dielectric layer directly on top of the stack of oxide layers.

10. The method according to claim 1, further comprising forming a contact etch stop layer contacting and lining upper surfaces of the first logic gate electrode and the first logic gate dielectric.

11. The method according to claim 1, further comprising:
forming a second logic device comprising a second logic gate electrode separated from the substrate by a second logic gate dielectric,
wherein the second logic gate dielectric is formed directly on an upper surface of the substrate higher than the logic device trench.

12. The method according to claim 11, wherein the second logic gate electrode is made of metal.

13. The method according to claim 12, wherein the first logic gate electrode is formed with polysilicon.

14. The method according to claim 11, further comprises:
forming a lower inter-layer dielectric layer between a control gate electrode within the memory region and the second logic gate electrode within the logic region,
wherein the lower inter-layer dielectric layer has a planar top surface even with top surfaces of the pair of control gate electrodes and the second logic gate electrode.

15. The method according to claim 14, further comprises:
forming an upper inter-layer dielectric layer overlying the lower inter-layer dielectric layer; and
forming a contact via through the upper inter-layer dielectric layer and the lower inter-layer dielectric layer reaching the first logic gate electrode.

16. The method according to claim 11, further comprising:
forming a third logic device comprising a third logic gate electrode separated from the substrate by a third logic gate dielectric, wherein the third logic gate dielectric is formed directly on the upper surface of the substrate higher than the logic device trench,
wherein the first logic gate dielectric of the first logic device is formed with a first oxide layer on the substrate, a first portion of a second oxide layer disposed on the first oxide layer, and a first portion of a third oxide layer disposed on the first portion of the second oxide layer, and
wherein the second logic gate dielectric of the second logic device is formed with a second portion of the second oxide layer on the substrate and a second portion of the third oxide layer on the second portion of the second oxide layer;
wherein the third logic gate dielectric of the third logic device is formed with a third portion of the third oxide layer on the substrate.

17. The method according to claim 1, wherein the logic isolation structure is formed with a top surface coplanar with that of the first logic gate electrode.

18. A method for forming an integrated circuit (IC), the method comprising:
providing a substrate including a memory region, a logic region, and a boundary region defined between the memory region and the logic region;
forming a plurality of deep trenches from a top surface of the substrate, including a memory isolation trench in the memory region, a logic isolation trench in the logic region, a boundary trench in the boundary region, and a logic device trench in the logic region between the logic isolation trench and the boundary trench;
filling an isolation material in the plurality of deep trenches including the memory isolation trench, the logic isolation trench, the boundary trench, and the logic device trench;
removing the isolation material from the logic device trench;
filling a first logic gate dielectric and a first logic gate electrode in the logic device trench; and
forming first and second source/drain regions in the substrate on opposite sides of the logic device trench with a top surface coplanar with that of the first logic gate electrode.

19. The method according to claim 18, wherein the first logic gate dielectric and the first logic gate electrode are formed in conformal along surfaces of the logic device trench, and a hard mask layer is formed on a top surface of the first logic gate electrode filling in a remaining space of the logic device trench.

20. A method for forming an integrated circuit (IC), the method comprising:
providing a substrate including a memory region, a logic region, and a boundary region defined between the memory region and the logic region;
forming a plurality of deep trenches from a top surface of the substrate, including a memory isolation trench in the memory region, a logic isolation trench in the logic region, a boundary trench in the boundary region, and a logic device trench in the logic region between the logic isolation trench and the boundary trench;

filling an isolation material in the plurality of deep trenches including the memory isolation trench, the logic isolation trench, the boundary trench, and the logic device trench;
forming and patterning a multilayer film to form a plurality of memory cell structures on the memory region;
forming a dummy capping layer overlying the memory cell structures;
removing the isolation material from the logic device trench; and
filling a first logic gate dielectric and a first logic gate electrode in the logic device trench.

* * * * *